United States Patent
Chainer et al.

(10) Patent No.: US 9,445,529 B2
(45) Date of Patent: Sep. 13, 2016

(54) LIQUID COOLED DATA CENTER DESIGN SELECTION

(75) Inventors: Timothy J. Chainer, Putnam Valley, NY (US); Madhusudan K. Iyengar, Woodstock, NY (US); Pritish R. Parida, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 775 days.

(21) Appl. No.: 13/479,265

(22) Filed: May 23, 2012

(65) Prior Publication Data

US 2013/0317785 A1   Nov. 28, 2013

(51) Int. Cl.
G06G 7/56   (2006.01)
H05K 7/20   (2006.01)

(52) U.S. Cl.
CPC ........ H05K 7/2079 (2013.01); H05K 7/20836 (2013.01)

(58) Field of Classification Search
CPC . G06F 17/50; H05K 7/20836; H05K 7/2079
USPC .......................................................... 703/5
See application file for complete search history.

(56) References Cited

U.S. PATENT DOCUMENTS 7,791,882 B2 *   9/2010   Chu et al. ..................... 361/698
8,113,010 B2 *   2/2012   Carlson ........................ 62/259.2
2008/0184044 A1   7/2008   Leech et al.
2011/0077795 A1   3/2011   VanGilder et al.
2011/0307820 A1   12/2011   Rasmussen et al.

FOREIGN PATENT DOCUMENTS

EP        2009563 A1        12/2008
WO    WO 2009111243 A1    9/2009
WO    WO2010017429 A2      2/2010

OTHER PUBLICATIONS

Timothy Chainer, "Economizer Based Data Center Liquid Cooling with Advanced Metal Interfaces," Mar. 2011, IBM Corporation, pp. 1-21.*

Thomas J. Breen et al., "From chip to cooling tower data center modeling: Part I Influence of server inlet temperature and temperature rise across cabinet," 2010, 12th IEEE Intersociety conference on Thermal and Thermomechanical Phenomena in Electronic Systems, Las Vegas, ten pages.*

Madhusudan Iyengar et al., "Analytical modeling for thermodynamic characterization of data center cooling systems," 2009, Journal of Electronic Packaging, vol. 131, pp. 1-9.*

(Continued)

*Primary Examiner* — Kamini S Shah
*Assistant Examiner* — Russ Guill
(74) *Attorney, Agent, or Firm* — Daniel P. Morris; Otterstedt, Ellenbogen & Kammer, LLP

(57) ABSTRACT

Input data, specifying aspects of a thermal design of a liquid cooled data center, is obtained. The input data includes data indicative of ambient outdoor temperature for a location of the data center; and/or data representing workload power dissipation for the data center. The input data is evaluated to obtain performance of the data center thermal design. The performance includes cooling energy usage; and/or one pertinent temperature associated with the data center. The performance of the data center thermal design is output.

15 Claims, 19 Drawing Sheets

(56) References Cited

OTHER PUBLICATIONS

Dustin W. Demetriou et al., "Development and experimental validation of a thermo-hydraulic model for data centers," 2011, HVAC&R Research, vol. 17, No. 4, pp. 540-555.*

R. Schmidt et al., "Thermodynamics of information technology data centers," 2009, IBM Journal of Research & Development, vol. 53, No. 3, pp. 1-15.*

Brandon A. Rubenstein et al., "Hybrid cooled data center using above ambient liquid cooling," 2010, 12th IEEE Intersociety conference on Thermal and Thermomechanical Phenomena in Electronic Systems, Las Vegas, ten pages.*

Daniel Gmach et al, "Profiling Sustainability of Data Centers", May 2010.

Pritish R Parida, et al. "Coolant and Ambient Temperature Control for Chillerless Liquid Cooled Data Centers", U.S. Appl. No. 13/439,471, filed Apr. 4, 2012.

Madhusudan K. Iyengar, et al. "Data Center Coolant Switch" U.S. Appl. No. 13/184,239, filed Jul. 15, 2011.

Timothy J. Chainer, et al. "Energy Efficient Data Center Liquid Cooling With Geothermal Enhancement". U.S. Appl. No. 13/252,888, filed Oct. 4, 2011.

Pritish R. Panda et al., "Dynamically Limiting Energy Consumed by Cooling Apparatus". U.S. Appl. No. 13/305,967, filed Nov. 29, 2011.

J.G. Koomey, "Growth in Data Center electricity use 2005 to 2010", Oakland, CA: Analytics Press., Aug. 2011.

"Vision and Roadmap: Routing Telecom and Data Centers toward Efficient Energy Use", US Dept. of Energy, May 13, 2009.

Brown, et. al., "Report to Congress on Server and Data Center Energy Efficiency", Public Law 109-431, U.S. Environmental Protection Agency, Energy Star Program, Aug. 2, 2007.

Greenberg, et. al., "Best Practices for Data Centers: Lessons Learned from Benchmarking 22 Data Centers", 2006 ACEEE Summer Study on Energy Efficiency in Buildings.

Ashrae, "Thermal Guidelines for Data Processing Environments—Expanded Data Center Classes and Usage Guidance", TC 9.9 Mission Critical Facilities, 2011.

LBNL, "High-Performance Buildings for High-Tech Industries, Data Centers". Downloadedfrom http://hightech.lbl.gov/datacenters.html on May 23, 2012.

Moss et. al., "Chiller-less Facilities: They May Be Closer Than You Think", Dell technical white paper, 2011.

M. Iyengar, et al. "Liquid Cooled Servers . . . Energy Savings—Part 1: Hardware Concept Design and Build", Submitted for peer review to the Transactions of the IEEECPMT, 2011.

M. Iyengar, et al. Liquid Cooled Servers . . . Energy Savings—Part 2: Experimental Characterization. Submitted for peer review to the Transactions of the IEEE-CPMT, 2011.

M. Iyengar, et al.Server Liquid Cooling with Chiller-less Data Center Design to Enable Significant Energy Savings, IEEE SEMITherm Conference 2012.

M. David, et al. "Experimental Characterization of an Energy Efficient . . . Test Facility with Warm Water Cooled Servers", IEEE SEMITherm Conference 2012.

P. Parida, et al. "Experimental Investigation of Water Cooled Server Microprocessors and Memory Devices . . . Chiller-less Data Center", IEEE SEMITherm Conference 2012.

Brandon A Rubenstein, et al. "Hybrid Cooled Data Center Using Above Ambient Liquid Cooling". 2010 IEEE.

* cited by examiner

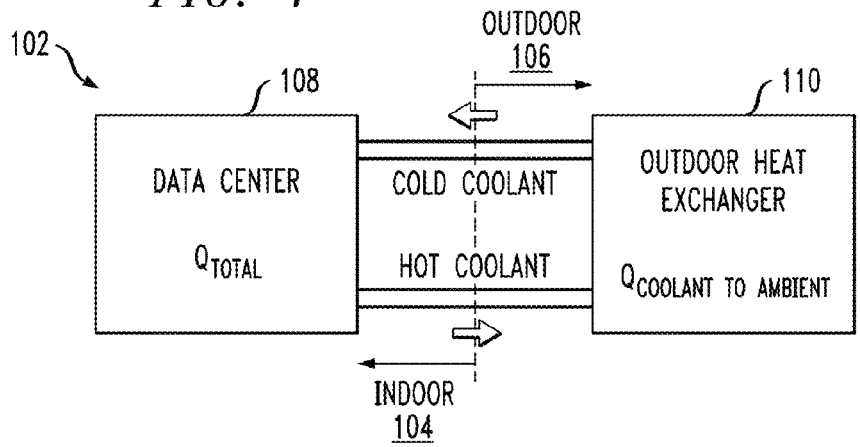
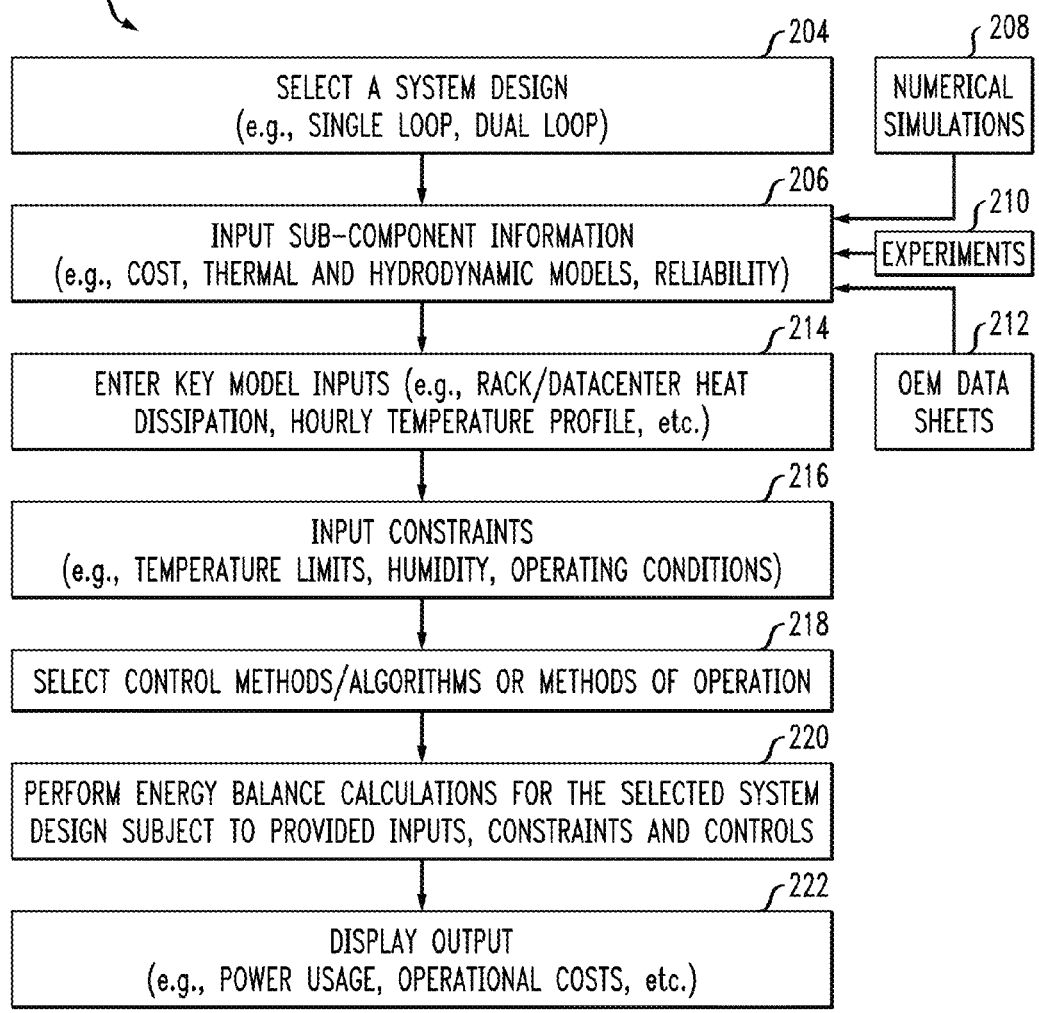

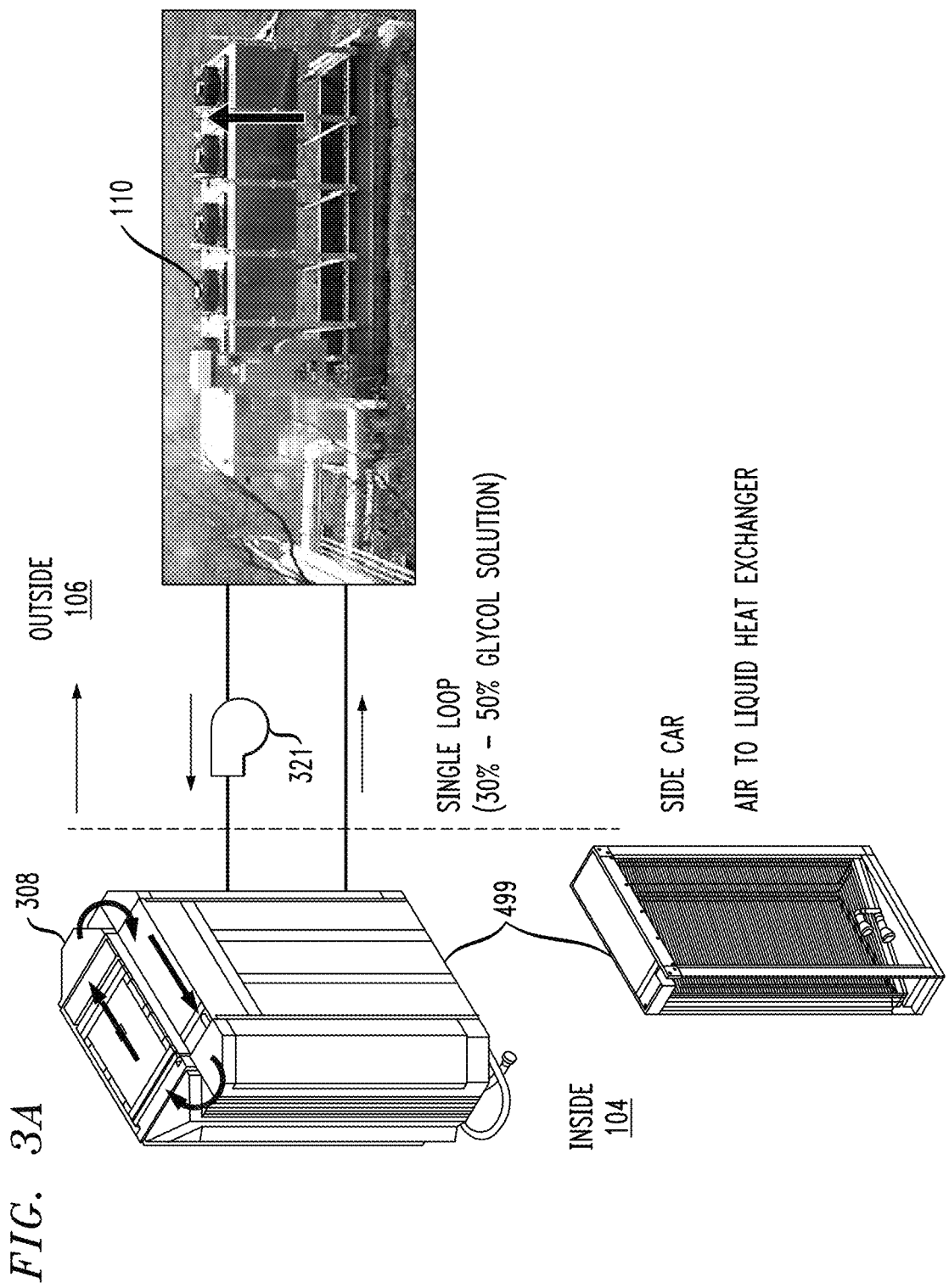

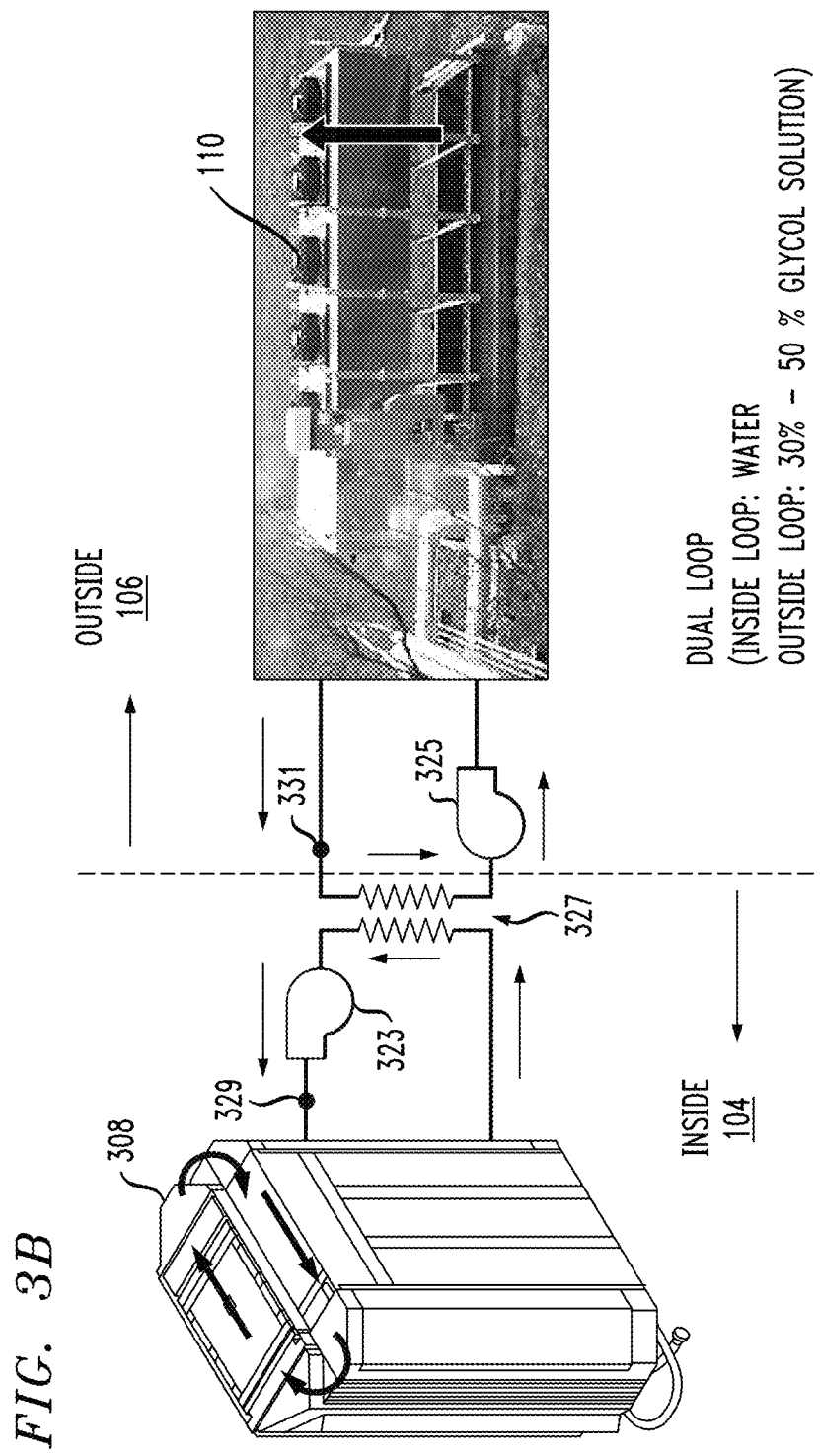

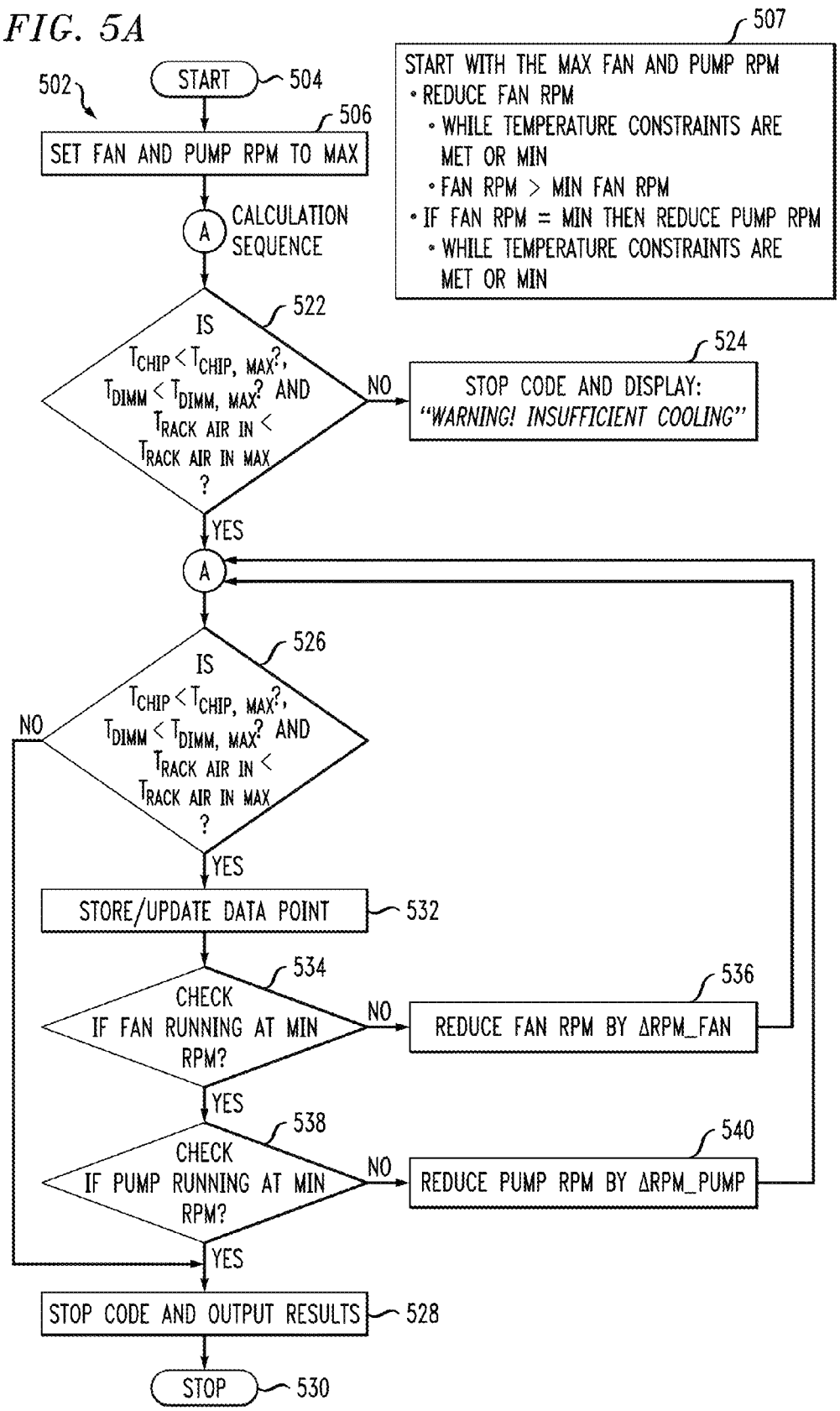

LIQUID COOLED DATA CENTER DESIGN SELECTION

STATEMENT OF GOVERNMENT RIGHTS

This invention was made with Government support under Contract No.: DE-EE0002894 (Department of Energy). The Government has certain rights in this invention.

CROSS-REFERENCE TO RELATED APPLICATIONS

Not Applicable.

FIELD OF THE INVENTION

The present invention relates to the thermodynamic arts, and, more particularly, to thermal control of computer equipment and the like.

BACKGROUND OF THE INVENTION

Data centers are facilities that house numerous computer systems arranged in the form of electronics racks. Typically, a data center houses between tens and hundreds electronics racks. Each computer system in a rack may include one or more processors, memory devices, controllers, power converters and manipulators and other such electronic components. Depending upon the state of operation, a computer system may dissipate on the order of a few hundred watts to a few kilowatts. A significant amount of cooling is therefore required to keep the electronic components within an optimum operating temperature range (typically, 60° C.-100° C.). Recent studies have shown the cooling energy to be 25%-40% of the total data center energy.

SUMMARY OF THE INVENTION

Principles of the invention provide techniques for liquid cooled data center design selection. In one aspect, an exemplary method includes the step of obtaining input data. The input data specifies aspects of a thermal design of a liquid cooled data center. The input data includes data indicative of ambient outdoor temperature for a location of the data center; and/or data representing workload power dissipation for the data center. A further step includes evaluating the input data to obtain performance of the data center thermal design. The performance includes cooling energy usage; and/or one pertinent temperature associated with the data center. A still further step includes outputting the performance of the data center thermal design.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed; or by sending signals to control a valve, fan, or the like, based on sensed temperature, pressure, flow, or the like. For the avoidance of doubt, where an actor facilitates an action by other than performing the action, the action is nevertheless performed by some entity or combination of entities.

One or more embodiments of the invention or elements thereof (for example, system control and/or system design) can be implemented in the form of or otherwise facilitated by, a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), software module(s) stored in a computer readable storage medium (or multiple such media) and implemented on a hardware processor, or (iii) a combination of (i) and (ii); any of (i)-(iii) implement the specific techniques set forth herein. Examples of use of a computer program product or computer-related means include sending signals to control a valve, fan, or the like, based on sensed temperature, pressure, flow, or the like; and/or use of a computer for computer-aided system design.

Techniques of the present invention can provide substantial beneficial technical effects. In one or more embodiments, a significant technical benefit is in guiding design choices by quantifying the cost, energy and performance impact of the design choices. The cost, performance and energy usage of a data center is essentially dependent upon the physical infrastructure and environmental conditions both inside and outside the data center. While designing a system it is important to understand the cost, energy and performance impact of the design choices. Understanding and being able to quantify such impacts can significantly help guide system level design decisions; help quantify single component impact on the system performance and capital and operational costs; help relate the cooling requirements to IT load, environmental conditions, components costs and other such parameters; help identify possible failure locations to enable better design selection and help explore and/or compare numerous design variations and identify an ideal cost-effective cooling solution within provided constraints.

These and other features and advantages of the present invention will become apparent from the following detailed description of illustrative embodiments thereof, which is to be read in connection with the accompanying drawings.

BRIEF DESCRIPTION OF THE DRAWINGS

FIG. 1 shows an exemplary schematic of a datacenter model, according to an aspect of the invention;

FIG. 2 shows an exemplary flowchart of system designs simulator operation, according to an aspect of the invention;

FIGS. 3A and 3B show exemplary single and dual loop systems, according to aspects of the invention;

FIGS. 5A and 5B show an exemplary control technique and associated calculations sequence, according to aspects of the invention;

DETAILED DESCRIPTION OF PREFERRED EMBODIMENTS

Figure 4:
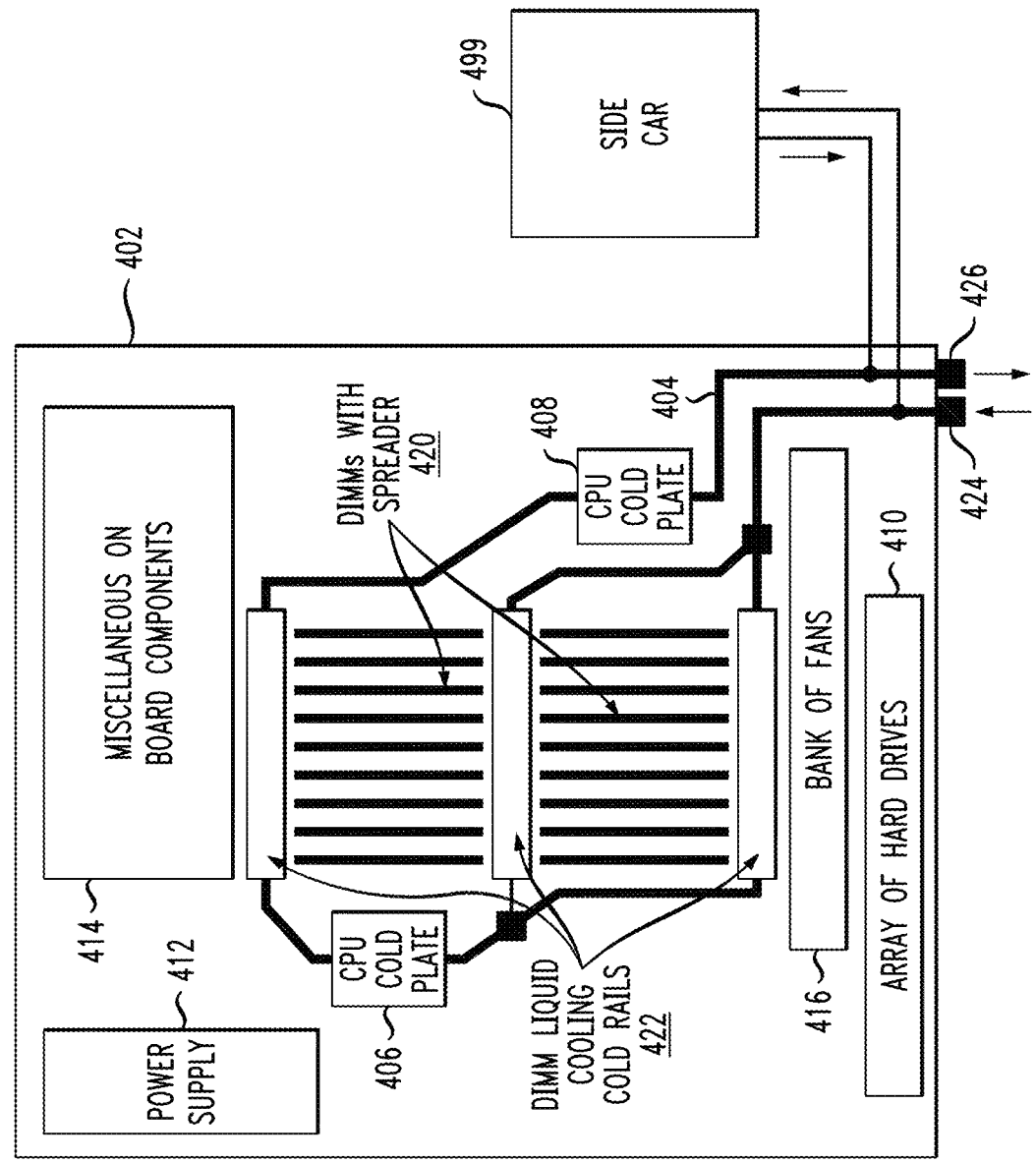
FIG. 4 shows an exemplary schematic of a node, according to an aspect of the invention.

As noted above, data centers are facilities that house numerous computer systems arranged in the form of electronics racks. Typically, a data center houses between tens and hundreds electronic racks. Each computer system in a rack may include one or more processors, memory devices, controllers, power converters and manipulators and other such electronic components. Depending upon the state of operation, a computer system may dissipate on the order of a few hundred watts to a few kilowatts. A significant amount of cooling is therefore required to keep the electronic components within an optimum operating temperature range (typically, 60° C.-100° C.). Recent studies have shown the cooling energy to be 25%-40% of the total data center energy.

A number of solutions have been proposed to reduce data center power consumption, such as transferring 100% of the heat dissipated by the rack(s) to water and eliminating the facility CRAC (Computer Room Air Conditioning) units; use of building chilled water to cool the racks; use of energy efficient chillers to provide relatively lower temperature coolants to the rack(s); ambient air cooling (e.g. air-side economizers); and others.

One or more embodiments advantageously provide techniques to assist in identifying an appropriate, and preferably the ideal, energy-efficient cost-effective cooling solution.

One or more embodiments advantageously provide a system design simulator to relate the cooling requirements to electronic equipment load, environmental conditions, components performance and costs and other such parameters, to identify an appropriate, and preferably ideal, energy-efficient and cost-effective cooling solution within provided constraints; to estimate the data center design impact on the total cooling power consumption; to perform a total cost of ownership analysis; to compare among feasible data center designs for any given application; to identify a single component impact on the system performance; to identify possible failure locations and/or components; and to explore various control techniques for any given data center cooling system.

One or more embodiments provide a new and useful process referred to as a system design simulator, which typically takes into account, but is not limited to, energy balance, component costs, environmental conditions and hydrodynamic and thermodynamic relations of individual components, to identify an appropriate and preferably ideal cost-effective cooling solution within provided constraints; to estimate the data center design impact on the total cooling power consumption; to help perform a total cost of ownership analysis; to compare among feasible data center designs for any given application; to identify a single component impact on the system's hydrodynamic and thermal performance; to identify possible failure locations and/or components and to explore various control techniques for any given data center cooling system. One or more embodiments advantageously enable the quick selection of an energy-efficient and cost-effective data center cooling solution subject to customer-provided constraints. It is to be noted that one or more embodiments have a variety of applications, and are not limited to the exemplary applications listed above.

One or more embodiments make use of a set of interdependent relations. Given the teachings herein, the skilled artisan will be able to implement same using, for example, high-level programming languages. In accordance with one or more embodiments, an exemplary system design simulator typically takes into account, but is not limited to, energy balance, component costs, environmental conditions and hydrodynamic and thermodynamic relations of individual components. System design simulators in accordance with one or more embodiments can be used to identify an appropriate, and preferably ideal, cost-effective cooling solution within provided constraints, to estimate the data center design impact on the total cooling power consumption, to help perform a total cost of ownership analysis, to compare among feasible data center designs for any given application, to identify a single component's impact on the system's hydrodynamic and thermal performance, to identify possible failure locations and/or components and to explore various control techniques for any given data center cooling system. Thus, one or more embodiments enable a quick selection of an energy- and cost-effective data center cooling solution subject to customer provided constraints. Again, it is to be noted that one or more embodiments have a variety of applications, and are not limited to the exemplary applications listed above.

The cost, performance and energy usage of a data center is typically dependent upon the physical infrastructure and environmental conditions both inside and outside the data center. While designing a system, it is important to understand the cost, energy and performance impact of the design choices. Understanding and being able to quantify such impacts can provide significant help to guide system level design decisions; help quantify single component impact on the system performance and capital and operational costs; help relate the cooling requirements to information technology (IT) load, environmental conditions, components costs and other such parameters; help identify possible failure locations to enable better design selection and help explore and/or compare numerous design variations and identify an ideal cost-effective cooling solution within provided constraints.

FIG. 1 schematically represents a data center system 102 with indoor and outdoor components 104, 106, respectively. The energy is exchanged between the indoor and outdoor components with the help of coolant(s) which could be either gaseous or liquid in nature. The cold coolant enters the data center 108 and collects all the heat dissipated by the rack(s) (and in a more general sense, by the data center), and convects it to the outside of the data center and dissipates it to the ambient (e.g., via outdoor heat exchanger 110). Thus, two pertinent inputs to the model and/or simulator are heat dissipation by the rack(s) (or by the data center, in a more general sense) and the outdoor ambient temperature. In general, a data center could be completely air cooled or partially air cooled and partially liquid cooled or completely liquid cooled. So, depending upon the cooling scheme, the physical infrastructure both inside and outside of the data center is defined. Hence, other pertinent inputs to the model and/or simulator include the sub-component thermodynamic and hydrodynamic models and sub-component costs. These sub-component models physically define a particular data center design. Additionally, various techniques and/or methods of operation can be implemented for a particular data center design to minimize the energy usage. Thus, control techniques and/or methods for reducing the energy usage are also defined as significant inputs to the simulator. Non-limiting examples of significant inputs to the system designs simulator include heat dissipation from the data center, outdoor ambient conditions, sub-components cost, thermodynamic and hydrodynamic models, and control techniques and/or methods for energy reduction.

FIG. 2 shows a flow diagram 202 summarizing the working of the system designs simulator for one approach. According to this method, as seen at 204, first a particular design is selected and then, at 206, the sub-component information is input. The sub-component information for a partially liquid cooled data center may include the type of coolant in the liquid loop(s), thermal resistance curves for the cold-plates used, pressure drop curves for the liquid cooling loop(s), cost of the individual components, heat transfer characteristics of the heat exchangers used, power usage curves for the pumps, fans and blowers and other such information that make the design unique. This sub-component information can be obtained, for example, through thermodynamics and hydrodynamics theory, numerical simulations 208, through experiments 210, through OEM (original equipment manufacturer) data sheets 212, or through a combination of these methods.

Pertinent model inputs are entered in step 214; for example, rack and/or data center heat dissipation, hourly temperature profile for the proposed site and the like.

After this, in step 216, a set of constraints are defined based on the anticipated working environment of the equipment such as maximum allowable junction temperatures for the processors, maximum allowable temperatures for the memory devices, hard-drives, and auxiliary board components, server inlet air temperatures, dew point temperature and other such constraints. Next a range of operating conditions is selected such as the time variation of the outdoor air temperature, time variation of heat dissipation from the rack and/or data center, and other such conditions. A control technique or a method of operation for the selected system is also selected, in step 218. Next, in step 220, energy balance analysis is performed using all the above information to evaluate the energy consumption of the selected design over a selected time-period at a particular physical location. The cost analysis is also performed to estimate the data center operational costs based on the "to-be" (i.e., proposed) location of the data center. This process can be automated to explore and compare among various design choices and physical locations. The results, such as power usage, operational costs, and so on are output in step 222.

A non-limiting example is now provided to help elaborate the working of system designs simulator. FIGS. 3A and 3B represent two liquid cooled data center cooling designs. It should be noted that one or more embodiments are generally applicable to liquid cooled data centers. In some instances, the data centers are chiller-less liquid cooled data centers. Exemplary embodiments are provided in the context of chiller-less liquid cooled data centers, but these exemplary embodiments are not intended to be limiting. FIG. 3A represents a single loop configuration which includes liquid cooled rack(s) 308 which incorporate(s) a side car 499, and outdoor heat exchanger(s) 110. The side car is an air-to-liquid heat exchanger, which transports heat from the air circulated in the rack 308 to the liquid loop.

The single loop includes a single coolant pump 321. FIG. 3B represents a dual loop configuration which includes liquid cooled rack(s), side car(s), or the like at 308; liquid-to-liquid heat exchanger(s) 327; and outdoor heat exchanger (s) 110. The indoor loop includes pump 323. Coolant in the indoor loop picks up heat from the heat sources 308 and transfers it to the coolant in the outdoor loop in heat exchanger 327. The outdoor loop in turn rejects the heat to the ambient environment in heat exchanger 110. All the heat dissipated by the electronic rack(s) is transferred to the liquid coolant either by direct thermal conduction or via the air to liquid side car heat exchanger.

FIG. 3B is thus an exemplary schematic of a chiller-less data center liquid cooling design. A rack heat extraction heat exchanger along with the modular water unit or MWU (liquid-to-liquid heat exchanger 327 and one of the pumps 323) is installed inside the building. The outdoor heat rejection unit 110 and the other pump 325 are installed outside the building. Since refrigeration-based components are completely eliminated in the exemplary approach, the air and the water temperatures entering the server are closely related to the outdoor ambient conditions. In some cases, a pre-rack coolant temperature sensor is provided at 329 and a pre-MWU coolant temperature sensor is provided at 331.

Figure 18:
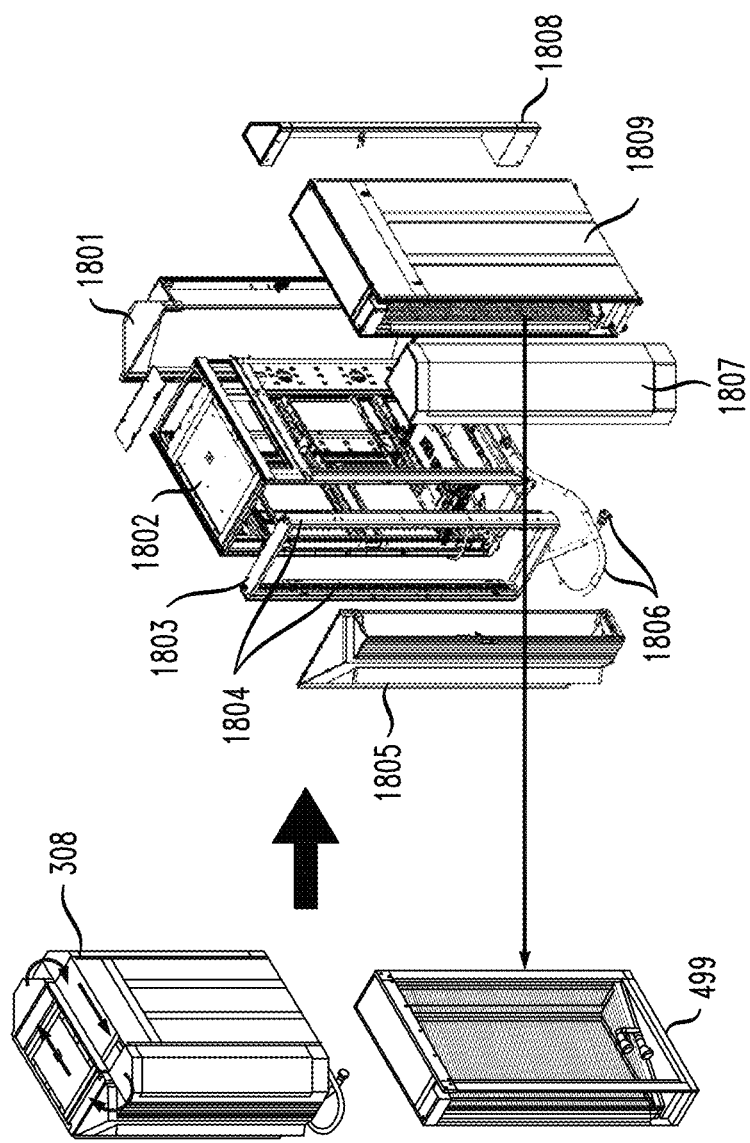
FIG. 18 is an exploded pictorial view of a rack and side car heat exchanger.

FIG. 18 shows exemplary details of rack 308 and side car 499. Note rear cover 1801, rack 1802, extender frame 1803, rack level manifolds 1804, front cover 1805, hose connections 1806, front angle 1807, rear angle 1808, and side frame 1809 for heat exchanger coil.

FIG. 4 shows a schematic of a volume server node 402 with a liquid cooling loop 404. At the server, the heat dissipated by the processors and the memory modules are conducted to the liquid coolant through the cold-plates 406, 408. Other board components such as the hard-drives 410, power supply 412, and miscellaneous board components 414 are air cooled. The heat collected by air is dissipated to the liquid coolant through the side-car heat exchanger 499, discussed further below. In case of a single loop design, the heat is then transported to the outdoor heat exchanger(s) where it is dissipated to the ambient air. In case of a dual loop, the heat is first transferred from the inner coolant loop to the outer coolant loop via liquid-to-liquid heat exchanger (s) and is then transported to the outdoor heat exchanger(s) where it is dissipated to the ambient air. The rate of heat transfer at the server(s) and the side car(s) level is predominantly governed by the liquid coolant flow rate through them and the air flow inside the rack provided by the server fans 416. At the outdoor heat exchanger side, the heat transfer rate is governed by the air-side flow rate and the liquid coolant flow rate through the outdoor heat exchanger.

Still with regard to FIG. 4, server 402 has a node liquid cooling loop 404 having liquid cooling components for both the micro-processors and the Dual In-line Memory Modules (DIMMs) 420. Note inlet 424 and outlet 426. The microprocessor modules are cooled using cold plate structures 406, 408 while the DIMMs 420 are cooled by attaching them to a pair of conduction spreaders which are then bolted to a cold rail 422 that has water flowing through it. The loops are designed, modeled and characterized using computational fluid dynamics modeling tools. The microprocessors and DIMMs have a typical maximum power of 130 W and 6 W, respectively. Other server components such as the power supply 412, hard-disk drives 410 and other miscellaneous components 414 are air-cooled. Partially water cooled server 402 can be designed, for example, to accept as high as 45° C. water and 50° C. air into the node.

The server node 402 can be installed, for example, in a rack heat extraction exchanger (server rack with liquid cooling manifolds and side car air-to-liquid heat exchanger) to completely remove heat at the rack level either by direct thermal conduction or indirect air to liquid heat exchange. The air flow inside the rack enclosure can be provided by the server fans 416, for example. The liquid coolant can be circulated between the rack heat extraction exchanger and an outdoor heat rejection exchanger such as 110 to move the heat from the servers to the outdoor ambient air environment. A liquid-to-liquid heat exchanger 327 can be used, for example, to transfer the heat from the indoor rack heat extraction exchanger loop to the outdoor heat rejection exchanger loop.

Side car 499 is connected to the input coolant line 424 and the output coolant line 426. The side car is a liquid-to-air heat exchanger which cools the air used to cool the air-cooled components 410, 412, 414. A parallel-flow arrangement is depicted, wherein a portion of the coolant flows through the cold plates and cold rails, and a portion of the coolant flows through the side car. However, other arrangements can be employed. For example, the side car can be connected in series with the cold plates and cold rails: in a series connection, the side car could be connected upstream or downstream of the cold plates and cold rails. Valves and/or bypasses can be provided in one or more embodiments for flow control (e.g., in a parallel arrangement, to control the amount of liquid to the cold plates and cold rails on the one hand and to the side car on the other hand; or to switch between different flow configuration (parallel and series)). Connecting the side car 499 in series upstream of the cold plates and cold rails results in cooler air going through the node 402 and may be useful in situations where air-cooled components, such as hard drives 410, require additional cooling. Connecting the side car 499 in series downstream of the cold plates results in warmer air going through node 402, which may be useful in situations where heat going into the air at the server level should be minimized and heat going into the liquid at the server level should be maximized.

The heat transfer rate is a non-linear monotonically increasing function of air-side flow rate and liquid coolant flow rate. For any given heat exchanger design there is a limit to the air-side flow rate and liquid flow rate. These limits are used to guide the heat exchanger selection so as to meet the maximum cooling requirements (worst case scenario) by a safe margin. Worst case scenario here refers to highest ambient air temperature and highest heat dissipation at the rack(s), and in a more general sense, highest heat dissipation at the data center, occurring simultaneously. This situation is very rare and might not even occur over the entire life cycle of the data center. This may result in relatively high (more than required) cooling power consumption for almost the entire life cycle of the data center. Hence, a control technique, based on data center heat dissipation, on ambient air temperature and on other such parameters, is employed in one or more embodiments to properly reduce the cooling power consumption and further reduce the data center energy usage.

Figure 5B:
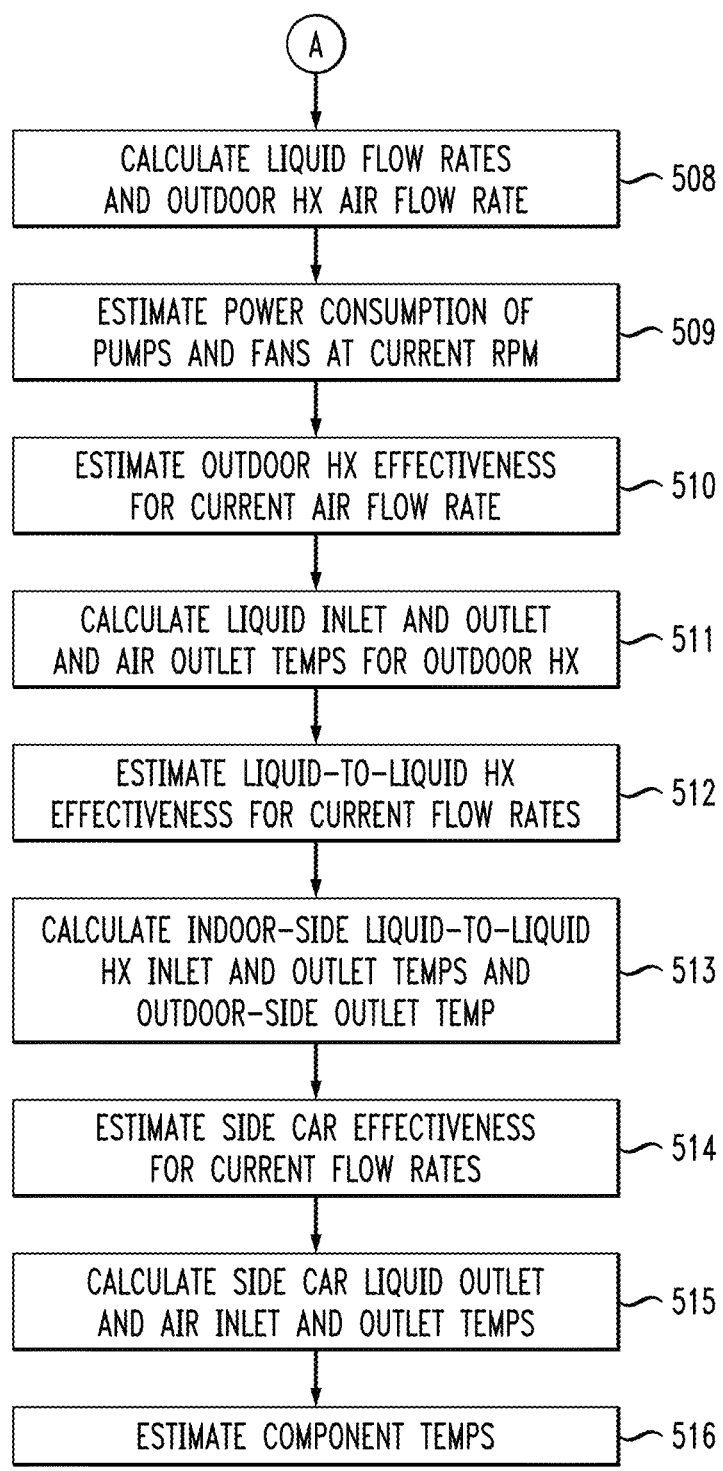

FIGS. 5A and 5B present a flowchart 502 summarizing a sample control technique and sequence of calculation for the single loop design (but with comments about the dual loop design also provided). Many different control techniques can be used; that depicted in FIG. 5A is exemplary and non-limiting. Other non-limiting examples of control techniques can be found in co-assigned U.S. patent application Ser. No. 13/305,967 of Inventors Timothy Chainer et al., entitled "DYNAMICALLY LIMITING ENERGY CONSUMED BY COOLING APPARATUS," filed on 29 Nov. 2011, the complete disclosure of which is expressly incorporated herein by reference for all purposes.

Processing begins in START step 504. According to this technique, the outdoor heat exchanger(s) fans RPM (revolutions per minute) and the outdoor pump(s) RPM are regulated individually, either continuously or in discrete steps, to satisfy multiple constraints such as CPUs' temperature, memory components' temperature, rack(s) inlet air temperature and other such constraints for a given outdoor ambient air temperature and rack and/or data center heat dissipation. The air flow rate and the liquid coolant flow rate are, in general, linear functions of fan RPM and pump RPM respectively. Based on the design criteria, if the fans and pumps are running at the highest rated RPM, the worst case scenario is satisfied thermally with a safe margin. Using this information and the fact that the fans usually consume the larger share of cooling energy, as shown at 506, select the start point of this control technique as fans and pumps at maximum RPM. As at 507, first, the fans' RPM is reduced while the temperature constraints are met or until the minimum fan RPM reached. If the fans are running at the lowest RPM, the pump RPM is reduced while the temperature constraints are met or until the minimum pump RPM is reached. This situation is for the single loop case. In case of the dual loop case, the indoor coolant pump(s) may run at a fixed or variable RPM.

Referring to FIG. 5B, the sequence of thermo- and hydro-dynamic calculations for this particular example includes the following general steps for a given outdoor ambient air temperature and rack and/or data center heat dissipation:

(a) As seen in step 508, for the current indoor and outdoor pumps RPM, calculate the corresponding indoor and outdoor loop liquid flow rate. Similarly, for the current fans RPM, calculate the outdoor heat exchanger's fan air flow rate. The relationship between the RPM and air/liquid flow rate could be obtained either by using OEM data sheets and relations or by using numerical simulations or combinations thereof. Analytical models as well as numerical simulations using commercially available software such as ANSYS® software (registered mark of ANSYS, Inc., Canonsburg, Pa. USA) and MACROFLOW software (available from Innovative Research, Inc., Plymouth, USA) can be used to generate the system pressure drop curves for different cooling configurations. OEM data sheets can be used to generate the pump head curves at different pump RPMs.

(b) As seen at step 509, using either OEM data sheets or analytical relations or experimental data, estimate the power consumption of the pumps and fans for the current RPM settings. In some cases, the total pumping power for the pumps can be calculated using the total pressure drop and volume flow rate in each loop. The pump electrical energy consumption can be determined using the pumping power and the estimated pump efficiency based on the system pressure curve. For the fans' power consumption, an experimentally obtained relationship between RPM and power consumption can be used.

(c) As per step 510, using either OEM data sheets or analytical relations or experimental data, estimate the outdoor heat exchanger effectiveness for the current air flow rate. In some cases, the analytical relations validated against experimental data can be used to estimate the outdoor heat exchanger effectiveness. Note that, as used herein, heat exchanger effectiveness is defined in its usual sense as understood by the skilled artisan, as the ratio between the actual heat transfer rate and the maximum possible heat transfer rate.

(d) As per step 511, using energy balance, outside air temperature and outdoor heat exchanger effectiveness, calculate liquid temperature entering and leaving the outdoor heat exchanger and hot air temperature leaving the outdoor heat exchanger. The IT heat load is typically used as the heat that is being dissipated to the outdoor ambient air.

(e) As per step 512, using either OEM data sheets or analytical relations or experimental data, estimate the liquid-to-liquid heat exchanger effectiveness for the current indoor and outdoor loop liquid flow rates. In some cases, the OEM relations can be used to estimate the liquid-to-liquid heat exchanger effectiveness.

(f) As per step 513, using energy balance, liquid temperature leaving the outdoor heat exchanger and liquid-to-liquid heat exchanger effectiveness, calculate liquid temperature entering and leaving the liquid-to-liquid heat exchanger on the indoor side and warm liquid temperature leaving the liquid-to-liquid heat Exchanger on the outdoor side. The IT heat load is typically used as the heat that is being exchanged between the indoor and the outdoor coolant loops.

(g) As per step 514, using either OEM data sheets or analytical relations or experimental data, estimate the side car air-to-liquid heat exchanger effectiveness at the current air flow rate inside the rack and liquid flow rate in the side car heat exchanger. In at least some cases, the analytical relations validated against experimental data can be used to estimate the side car heat exchanger effectiveness. For some servers, the RPM (or air flow rate) of the server fans changes predominantly based on the server inlet air temperature. The normal RPM changes due to load driven processor temperature rise can be eliminated in some cases where even under full power the processors were running below the temperatures which would normally cause processor driven fan rpm increases.

(h) As per step 515, using energy balance for side car, side car liquid inlet temperature and side car heat exchanger effectiveness, calculate air temperature entering and leaving the side car and hot liquid temperature leaving the side car. The heat load exchanged across the side car heat exchanger is a fraction of the total IT head load. The value of the fraction depends upon the kind of workload running on the servers. For example, for a processor intensive workload, the fraction could be 0.3 while for a memory intensive workload, the fraction could be 0.4.

Since the air temperature leaving the side car is used to determine the air flow rate across the side car and this air flow rate is used to determine the side car heat exchanger effectiveness, steps (g) and (h) are iterated using bisection method or the like for each sample to find an equilibrium solution.

(i) As per step 516, using the flow distribution and thermal resistance relations obtained from server level simulations or experiments; estimate the component temperatures such as for chips and DIMMs. In some cases, component level and node level simulations can be performed to generate the thermal resistance relations as functions of server level flow rates.

Calculation steps (a) through (i) can be repeated for each new set of RPM settings of the cooling system components.

Thus, after the calculation sequence of FIG. 5B is complete, in step 522, check whether the maximum allowable chip temperature has been exceeded, the maximum allowable DIMM temperature has been exceeded, and/or the maximum allowable rack air inlet temperature has been exceeded. If yes, stop the calculation at 524 and output a warning that there is already insufficient cooling ("N" branch of block 522). If no ("Y" branch of block 522), re-do the calculations at A and in step 526 repeat the check made in step 522. If yes ("N" branch of block 526), stop the calculation at 528, 530 and output results. If no ("Y" branch of block 526), in step 532, store or update the current data point(s). Then, in step 534, see if the fan is running at minimum RPM. If NO, at 536, reduce the fan RPM by a predetermined decrement ($\Delta$RPM_Fan) and loop back to A to re-do the calculations. If YES, at 538, see if the pump is running at minimum RPM. If NO, at 540, reduce the pump RPM by a predetermined decrement ($\Delta$RPM_Pump) and loop back to A to re-do the calculations. If YES, stop the calculation at 528, 530 and output results.

Figure 6:
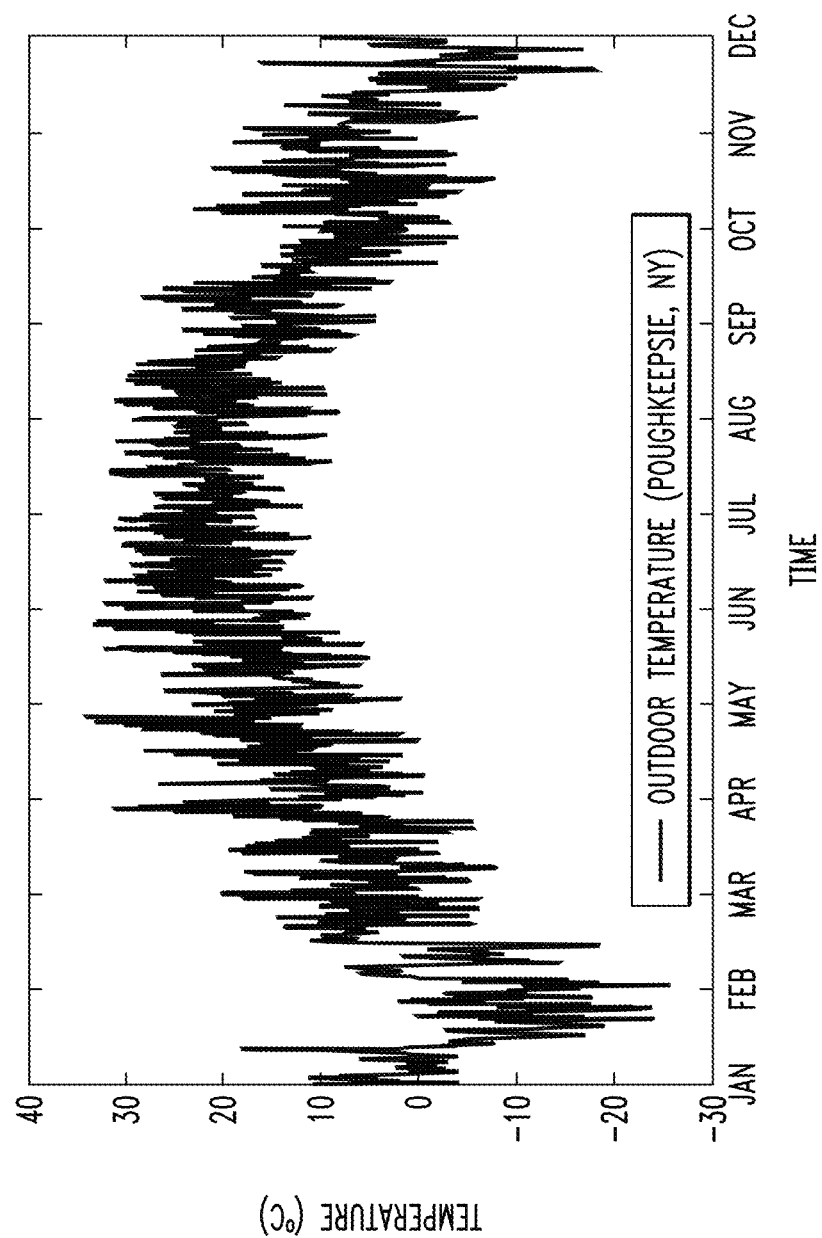
FIG. 6 shows exemplary system designs simulator input in the form of hourly temperature vs. time.

FIG. 6 shows a typical hourly temperature distribution for an entire year for Poughkeepsie, N.Y., USA. This data was taken from the NREL database. The NREL or National Renewable Energy Laboratory is located at 15013 Denver West Parkway, Golden, Colo. 80401-3305, USA. Similar hourly temperature distribution data for many other US cites can also be found at the NREL web site. Using this temperature distribution and a fixed amount of heat dissipation from the rack and/or data center, along with the sample control technique and the sub-component information as inputs to the system designs simulator, hourly cooling power consumption and the average cooling power consumption can be estimated.

Figure 7:
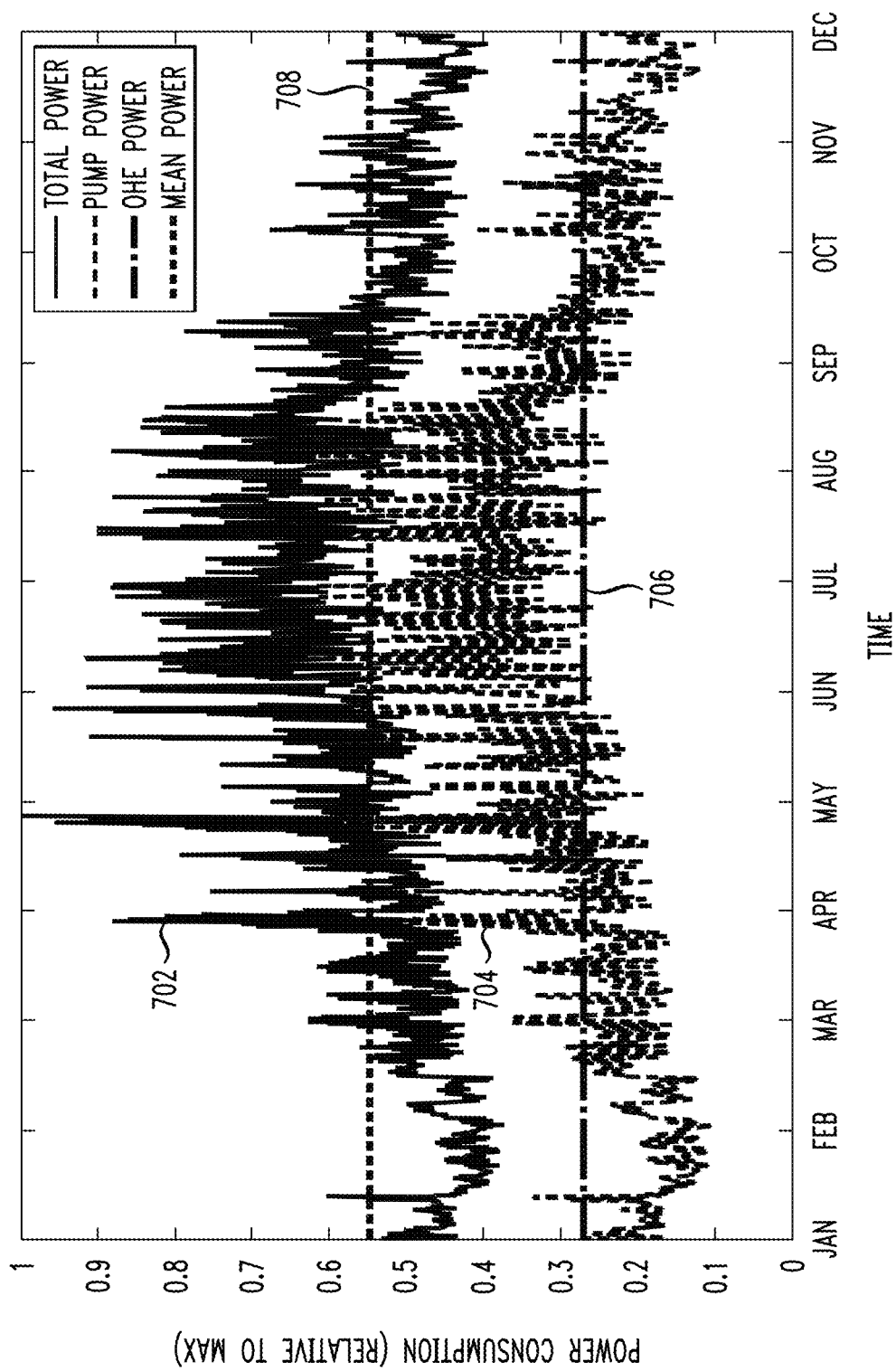
FIGS. 7 and 8 show data for dual and single loops, respectively.

FIG. 7 shows the hourly power consumption for a single loop design with Glycol 50 (50% by volume mixture of water and ethylene glycol) as the liquid coolant in the loop. In particular, curve 702 is total power usage; curve 704 is pump power usage; curve 706 is outdoor heat exchanger (OHE) power usage; and curve 708 is mean power usage.

Figure 8:
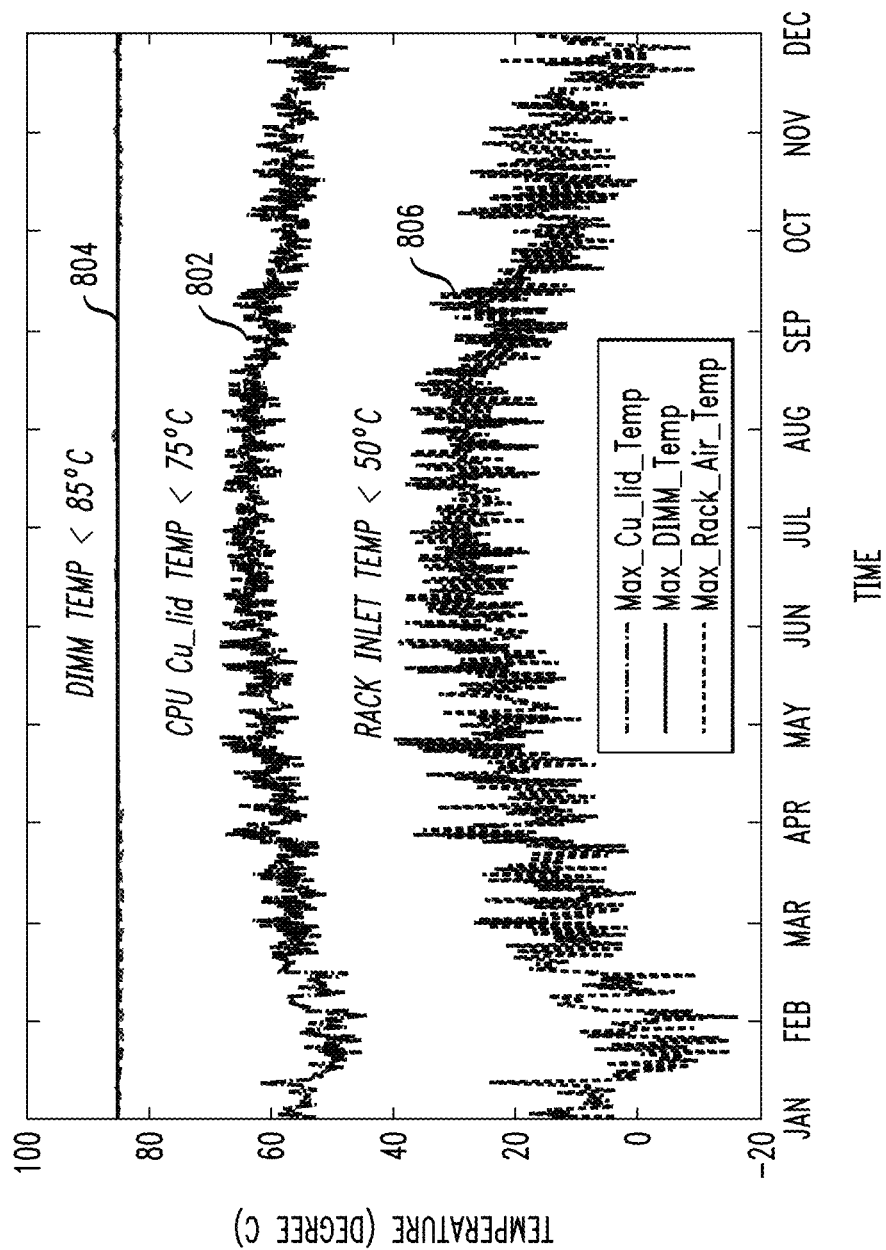

FIG. 8 shows the device temperatures and their corresponding constraints. It can be seen that for this particular case the cooling power consumption is predominantly governed by the DIMMs' temperature constraint. In this case the DIMMs were running close to their maximum temperature threshold while the rack air and server CPUs were overcooled. Hence, by improving the DIMM thermal design for this particular case, lower cooling power consumption can be achieved. In particular, curve 802 is copper lid temperature (maximum allowable 75 C) of the CPU module package; curve 804 is DIMM temperature (maximum allowable 85 C); and curve 806 is rack inlet air temperature (maximum allowable 50 C).

Figure 9:
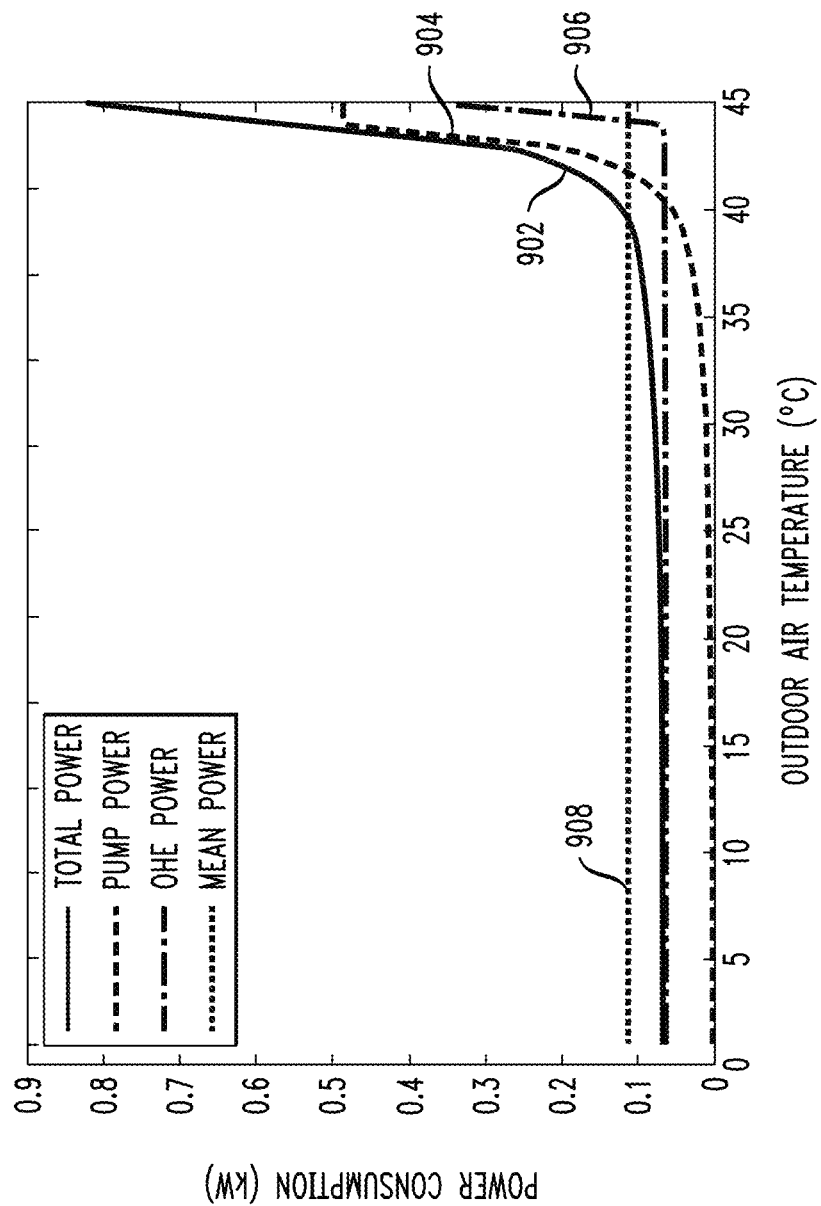
FIG. 9 shows variation of cooling power consumption with outdoor air temperature when a sample control technique is implemented, according to an aspect of the invention.

FIG. 9 shows how the cooling power consumption varies as a function of outdoor (ambient) air temperature when the exemplary control technique is applied to a single loop configuration. It can be seen that as the outdoor air temperatures decreases from 45 C to 0 C. first the outdoor fan rpm is reduced followed by reducing the pump rpm. In particular, curve 902 is total power usage; curve 904 is pump power usage; curve 906 is outdoor heat exchanger (OHE) power usage; and curve 908 is mean power usage.

Figure 10:
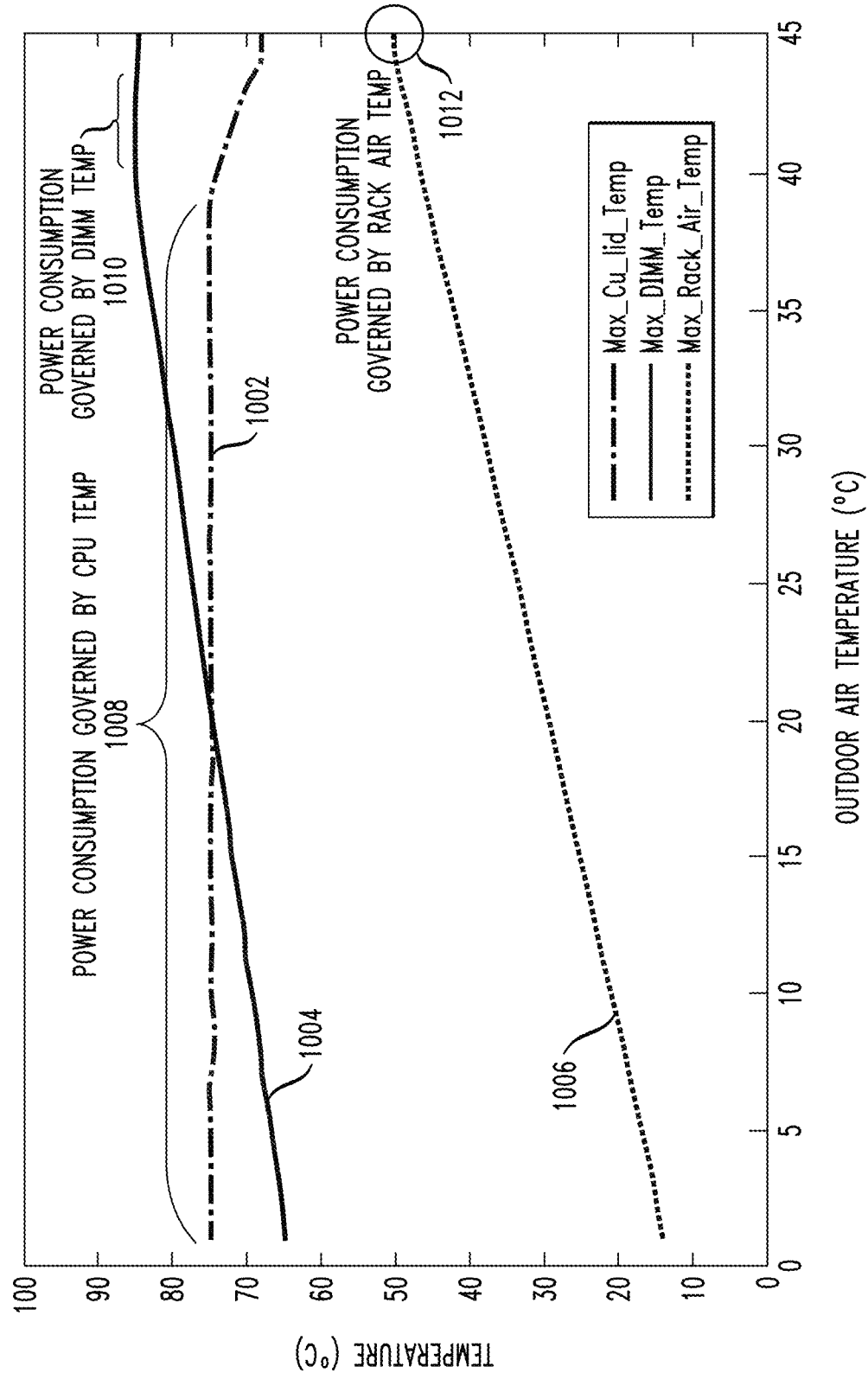
FIG. 10 shows variation of hottest CPU, hottest DIMM and rack inlet air temperatures with the outdoor/ambient air temperature when a sample control technique is implemented, according to an aspect of the invention.

FIG. 10 represents the variation of hottest CPU, hottest DIMM and rack inlet air temperatures with the outdoor (ambient) air temperature for an arbitrary, illustrative set of CPU and DIMM cold-plates. FIG. 10 also represents different outdoor (ambient) temperature ranges where the power consumption is either governed by the hottest CPU temperature constraint, or by the hottest DIMM temperature constraint, or by the rack inlet air temperature constraint. Thus, depending upon the location and operating conditions of the data center, either a high-cost high-performance or a low-cost low-performance sub-component could be selected. For example, for the case presented by FIG. 10, if the outdoor air temperature were never to exceed say, 25° C., a low-cost low performance DIMM cooling solution could be selected to lower the capital costs. In particular, curve 1002 is copper lid temperature of the CPU module package; curve 1004 is DIMM temperature; and curve 1006 is rack inlet air temperature. In region 1008, power consumption is governed by CPU temperature; in region 1010, power consumption is governed by DIMM temperature; and in region 1012, power consumption is governed by rack air temperature.

In the case of the single loop design, the coolant in the loop could be water or a water-glycol mixture or any other liquid depending upon the location of operation of the data center. For example, if this data center design is to be operated in Poughkeepsie, N.Y., the coolant in the loop should have an anti-freeze solution in the loop to prevent any damage due to sub-freezing ambient conditions in winter. Similarly, for the same location, the coolant in the outer coolant loop of the dual loop design should have an anti-freeze solution in the loop to prevent any damage due to sub-freezing ambient conditions in winter. The coolant in the inner coolant of the dual loop design could be any coolant such as water. However, depending upon the coolant in the loop(s), the thermodynamic and/or hydrodynamic performance of the system could change.

Figure 11:
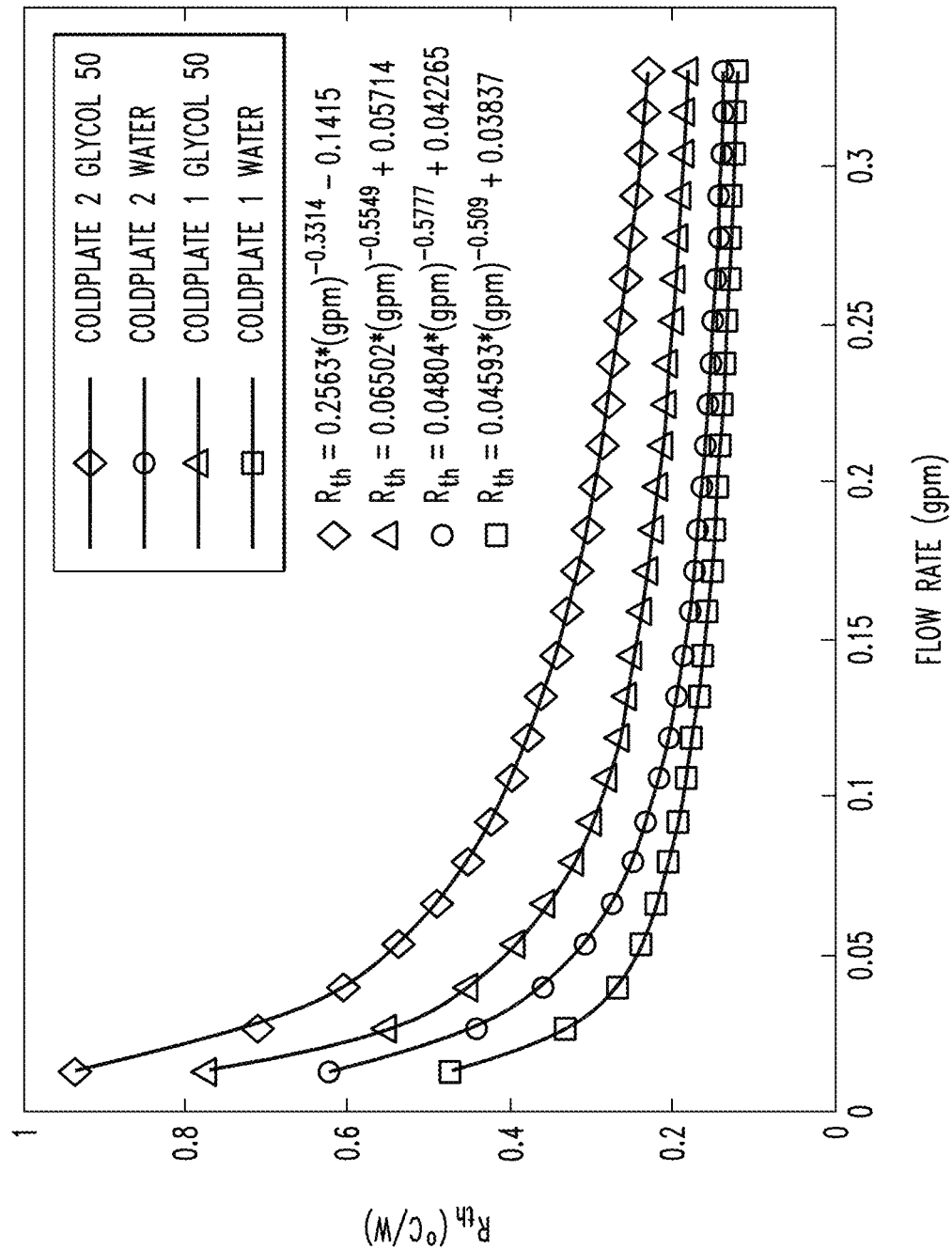
FIG. 11 shows thermal resistance plots for different cold-plates and different coolants.

FIG. 11 shows the thermal resistance curves for two different cold-plates—a high-cost high performance Cold-plate1 and a low-cost low performance Cold-plate2—with water and Glycol 50 as the coolants. The thermal resistance curves for the two cold-plates are different for different coolants and for different cold-plate designs. The hydrodynamic performance (that is, the pressure drop variation as a function of coolant flow rate) of the cold-plates is also different for different coolants and for different cold plate designs and could potentially have an impact on the total cooling power consumption. The system designs simulator helps quantify this impact as well. The cases are cold plate 1 with water, square symbols; cold plate 1 with Glycol 50, triangle symbols; cold plate 2 with water, circle symbols; and cold plate 2 with Glycol 50, diamond symbols. The corresponding correlations for the thermal resistance in C/W versus flow rate in gallons per minute (GPM) are shown next to the corresponding symbols.

Figure 12:
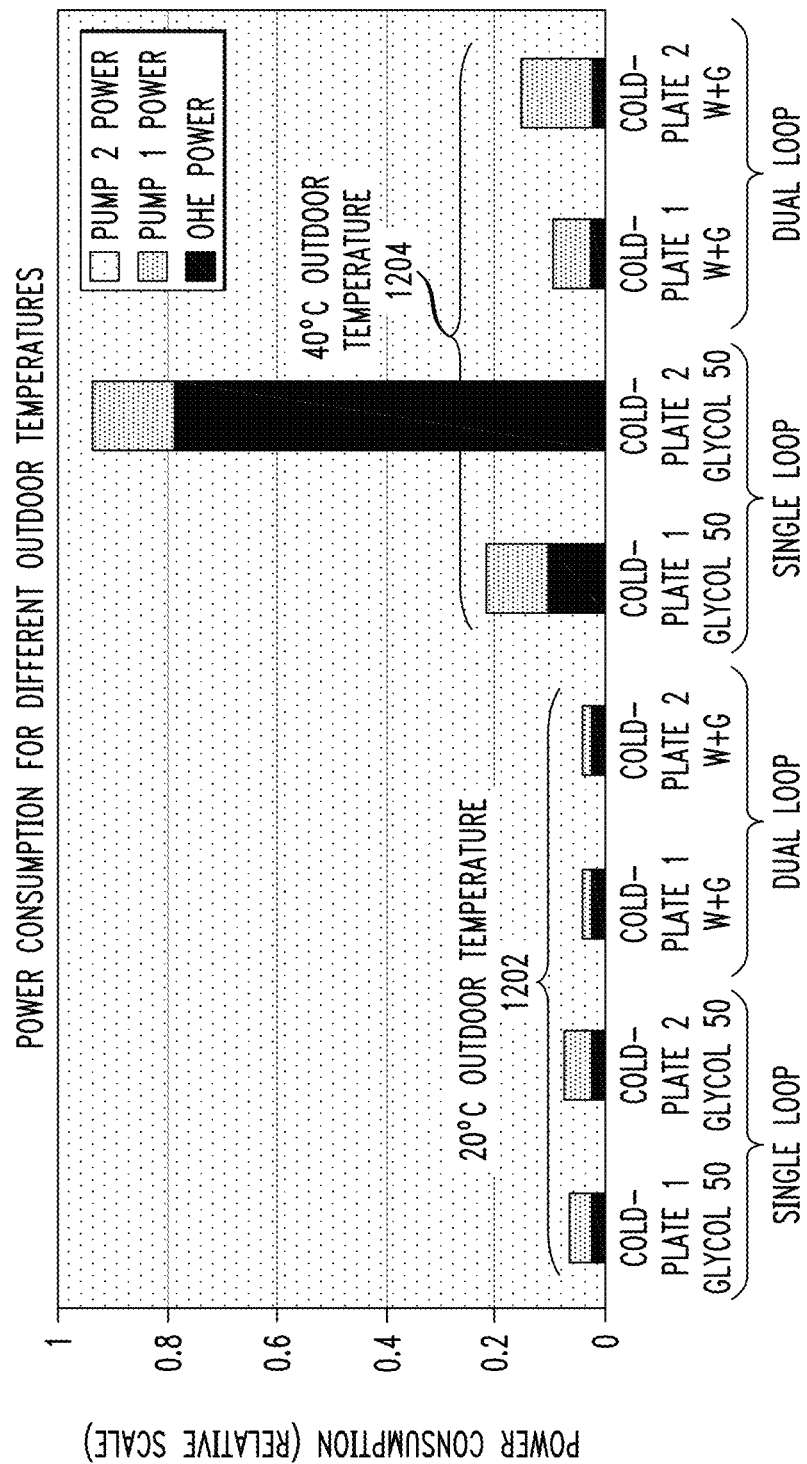
FIG. 12 shows data comparing single and dual loop designs.

FIG. 12 shows the cooling power usage comparison for these 4 possible cases—(i) Single loop with Cold-plate1, (ii) Single loop with Cold-Plate2, (iii) Dual loop with Cold-plate1, and (iv) Dual loop with Cold-plate2—for 20° C. and 40° C. outdoor air temperatures (1202, 1204, respectively). It can be seen that for a 20° C. outdoor air temperature, all the four cases show similar power usage. However, for a 40° C. outdoor air condition, the low thermal performance of the anti-freeze coolant causes the power consumption to be significantly higher than that for a corresponding dual loop design (that is, a dual loop with the same cold-plate). For the single loop systems, the lower band in each bar is OHE power and the upper band is Pump 1 power. For the dual loop systems, the lower band in each bar is OHE power, the middle band is Pump 1 power, and the upper band is Pump 2 power.

Figure 13:
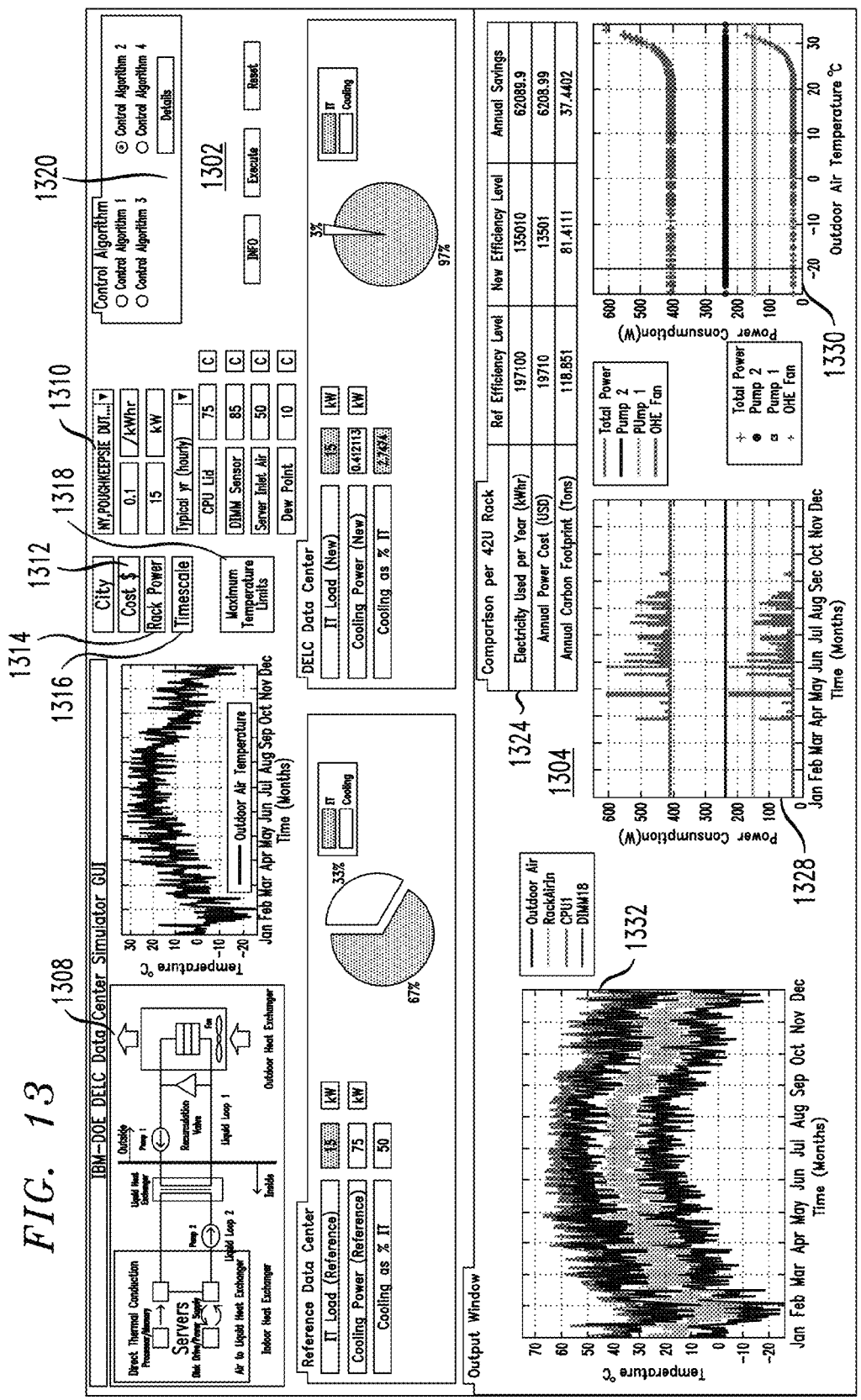
FIGS. 13 and 14 show exemplary system designs simulator graphical user interfaces for first and second cases, respectively, according to aspects of the invention.

FIG. 13 shows a graphical user interface (GUI) for the system designs simulator tool. The top half of the GUI 1302 is the input section where a user can select either a single loop design or a dual loop design (shown in the example at 1308); or select a to-be (i.e., proposed) data center physical location, such as Poughkeepsie (NY) 1310 or Raleigh (NC), or input an energy cost ($/kW-hr) 1312, or input the heat dissipation from the rack 1314, or select a time scale (year, month, week, etc.) 1316, or define temperature constraints 1318 such as CPU lid temperatures, DIMM temperatures etc., or select a particular control technique for energy reduction as at 1320. The bottom half of the GUI 1304 is the output section which shows the average cooling power consumption for the selected system design, shows the electricity usage, operational costs and associated carbon footprint for a typical year 1324, shows the annual energy savings, cost savings and reduction in carbon emissions. The output section also shows the plots of power consumption as a function of time 1328, plot of power consumption as a function of outdoor air temperature 1330, plots 1332 of, e.g., devices (CPU, DIMMs, Rack air, etc.) and coolant (water and glycol 50, in case of dual loop) temperatures as a function of time. The plot shown in FIG. 13 is for a dual loop design having water in the indoor coolant loop and Glycol 50 in the outdoor coolant loop with Poughkeepsie, N.Y. being the city.

FIG. 13 thus shows a simple graphical user interface that quickly and interactively shows system performance at different locations and highlights the benefits of exemplary liquid cooled chiller-less data center systems. The exemplary tool takes as inputs the location (that is, typical outdoor ambient air temperature profile), IT rack power, electricity cost per kW-hr and control technique. The typical outdoor ambient air temperature profile can be obtained from national databases such as those provided by NREL, as discussed elsewhere herein. The tool then outputs the temperature at various locations in the system such as pre-MWU, pre-Rack, Rack air, CPU and DIMM temperatures. The tool also outputs the total cooling power as a function of time and also as function of outdoor ambient air temperature. Various other plots, depending upon the need, can also be generated. The tool also calculates the annual average cooling power and represents it as a percentage of the IT power. Based on the average cooling power, the tool also calculates the annual energy and operational cost savings per 42 U rack as compared to a typical refrigeration based air cooled data center. In FIG. 13, the control technique selected was as follows: the data center test facility was continuously run for a day (~22 hours) with varying outdoor heat exchanger fan speeds and internal and external loop coolant flow rates set to 7.2 GPM and 7.1 GPM respectively. The outdoor heat exchanger fans were programmed to linearly vary in speed from 170 RPM to 500 RPM as the pre-MWU temperature varied from 30° C. to 35° C. For pre-MWU temperatures below 30° C. the fans ran at a constant speed of 170 RPM. Even that simple technique, the annual cooling power at Poughkeepsie, N.Y. can be less than 3% of the IT power leading to more than $6000 in annual savings in operational costs per 42 U rack of servers at a rate of $0.1/kW-hr. More energy-centric controls can be implemented to further increase these savings. Reference is made to the aforementioned co-assigned U.S. patent application Ser. No. 13/305,967, as well as to M. David, M. Iyengar. P. Parida, R. Simons, M. Schultz. M. Gaynes, R. Schmidt, T. Chainer, 2012, "Experimental Characterization of an Energy Efficient Chiller-less Data Center Test Facility with Warm Water Cooled Servers," IEEE SEMITherm Conference 2012. While it is believed that the skilled artisan will be familiar with this IEEE paper, nevertheless, the complete contents thereof are expressly incorporated herein by reference for all purposes.

Figure 14:
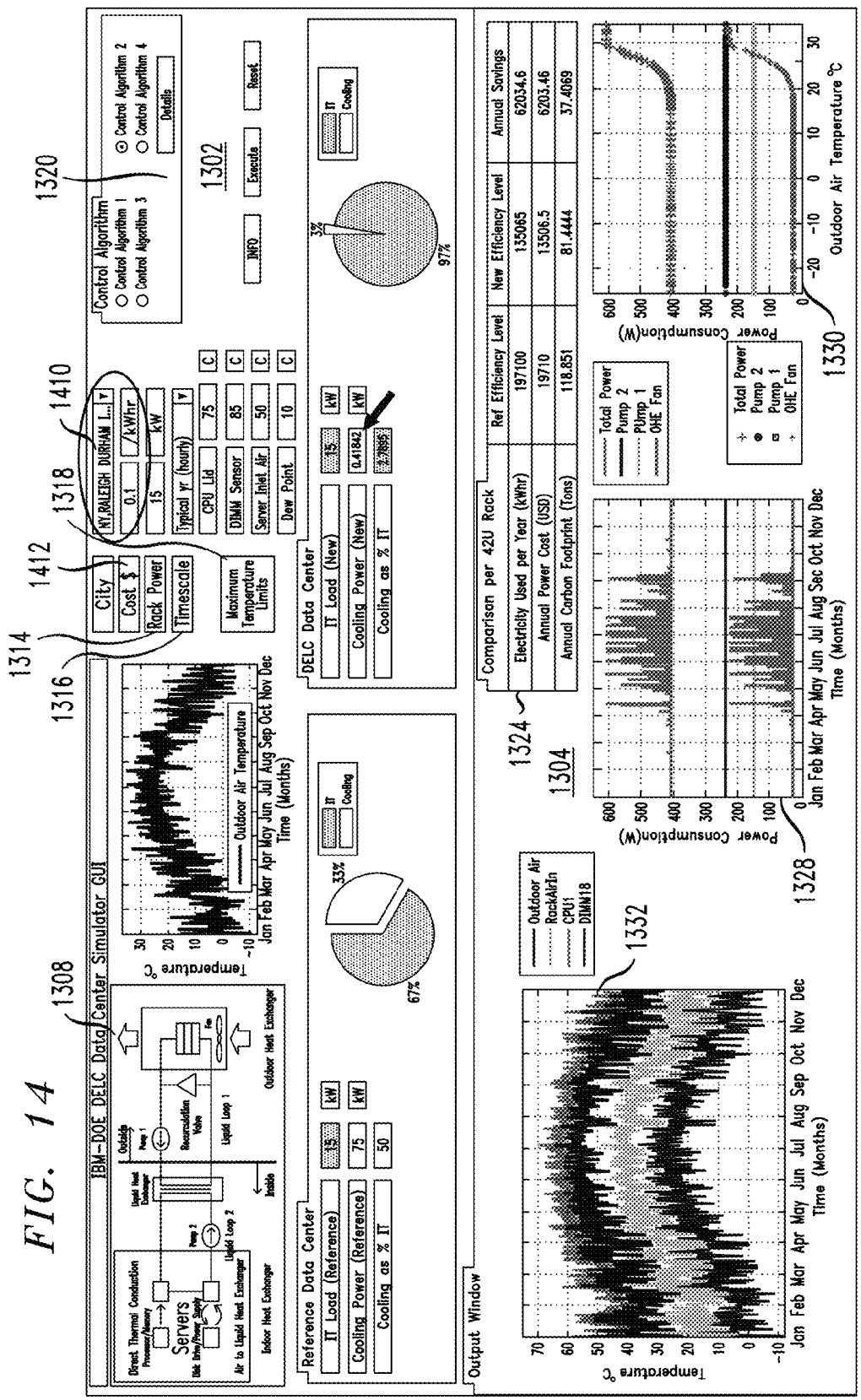

FIG. 14 shows similar plots for Raleigh, N.C. as the city. Similar reference characters indicate elements similar to FIG. 13. The location and electricity cost are re-numbered as 1410, 1412 to reflect the different values. It can be seen that although the energy consumption is higher in Raleigh than in Poughkeepsie, the annual energy cost in Raleigh is much lower than in Poughkeepsie due to lower $/kW-hr. This whole process can be automated to toggle between single loop design and dual loop design, to switch between different cities, to switch between different control techniques and other similar parameters and to estimate the best possible case having the lowest power usage or lowest operational costs or both out of all those possible cases.

In FIG. 14, the control technique is the same as that described just above. In Raleigh as well, the annual cooling power could be less than 3% of the IT power leading to significant operational cost savings. Raleigh has a relatively greater number of high temperature periods as compared to that in Poughkeepsie, resulting in relatively more hours of increased cooling power consumption. However, these periods of increased power consumption are only a small fraction of the year resulting in low annual average cooling power.

Thus, one or more embodiments advantageously provide a method of calculating the cooling energy use of a chiller-less data center with water cooled servers containing electronic equipment, in which the inputs are the local weather data for a typical year; the heat load profile of the electronic equipment; and thermal-hydraulic models and parameters of various cooling devices in the servers and the data center; the power usage characteristics of the various coolant pumping devices in the data center for varying coolant flow rates; the coolant pumping unit speed versus flow rate characteristics for various data center coolant pumping devices; a control technique for determining the speed of the coolant pumping units; and specifications for maximum values for various device temperatures; and in which the outputs are the total annual cooling energy use of all the coolant pumping devices and hour by hour device temperatures for various pertinent server devices and coolant locations.

The cost, performance and energy usage of a data center is typically dependent upon the physical infrastructure and environmental conditions both inside and outside the data center. While designing a system it is important to understand the cost, energy and performance impact of the design choices. Understanding and being able to quantify such impacts can significantly help guide system level design decisions; help quantify single component impact on the system performance and capital and operational costs; help relate the cooling requirements to IT load, environmental conditions, component costs and other such parameters; help identify possible failure locations to enable better design selection and help explore and/or compare numerous design variations and identify an ideal cost-effective cooling solution within provided constraints.

Single Loop vs. Dual Loop:

Consider again FIGS. 3A and 3B, which schematically represent two liquid cooled chiller-less data center designs. FIG. 3A represents a single loop design while FIG. 3B represents a dual loop design. The single loop design, as the name suggests, has a single liquid coolant loop convecting heat from the rack of servers to the outdoor ambient environment. In case of the single loop design, the coolant in the loop could be water or a water-glycol mixture or any other liquid depending upon the location of operation of the data center. For example, if this data center design is to be operated in Poughkeepsie, N.Y., the coolant in the loop should have an anti-freeze solution in the loop to prevent any damage due to sub-freezing ambient conditions in winters. Similarly, for the same location, the coolant in the outer coolant loop of the dual loop design should have an anti-freeze solution in the loop to prevent any damage due to sub-freezing ambient conditions in winters. The coolant in the inner coolant of the dual loop design could be any coolant such as water. However, depending upon the coolant in the loop(s), the thermodynamic and hydrodynamic performance of the system could change. Refer to the discussions of FIGS. 11 and 12 above.

Identifying Limiting Component:

The system model can also be used to identify limiting components of the system. Refer again to FIG. 10, which represents the variation of hottest CPU, hottest DIMM and rack inlet air temperatures with the outdoor (ambient) air temperature for a non-limiting arbitrary set of CPU and DIMM cold-plates. For this plot, a single coolant loop configuration with glycol 50% solution is considered and the outdoor ambient air temperature is assumed to vary from 0° C. to 45° C. Additionally, a simple control technique is selected. According to this technique, the outdoor heat exchanger(s) fan(s) RPM (revolutions per minute) and the outdoor pump(s) RPM are regulated individually either continuously or in discrete steps, to satisfy multiple constraints such as CPUs temperature, memory components temperature, rack(s) inlet air temperature and other such constraints for a given outdoor ambient air temperature and rack and/or data center heat dissipation. The air flow rate and the liquid coolant flow rate are, in general, linear functions of fan RPM and pump RPM respectively. Based on the design criteria, if the fans and pumps are running at highest rated RPM, the worst case scenario is satisfied thermally with a safe margin. Using this information and the fact that the fans usually consume the larger share of cooling energy, select the start point of this control technique as fans and pumps at maximum RPM. First, the RPM of the fans is reduced while the temperature constraints are met or until the minimum fan RPM reached. If the fans are running at the lowest RPM, the pump RPM is reduced while the temperature constraints are met or until the minimum pump RPM is reached. This situation is for single loop case. In case of the dual loop case, the indoor coolant pump(s) may run at a fixed RPM.

In FIG. 10, different outdoor (ambient) temperature ranges can be seen where the power consumption is either governed by hottest CPU temperature constraint, or by the hottest DIMM temperature constraint or by the rack inlet air temperature constraint. So, depending upon the location and operating conditions of the data center, either a high-cost high-performance or a low-cost low-performance sub-component could be selected. For example, for the case represented FIG. 10, if the outdoor air temperature were never to exceed, say, 30° C., a low-cost low performance DIMM cooling solution could be selected to lower the capital costs.

Thus, one or more embodiments advantageously provide a method of designing and selecting cooling configurations for a liquid cooled data center such as a chiller-less liquid cooled data center. In some instances, a method of designing a liquid cooled data center includes inputting at least one of component thermal designs, component and system thermal-hydraulic models, active cooling elements performance curves, weather data and/or geographic location, IT workload power, and control method. The method further includes using the input parameters to determine the quasi-static performance of the system including cooling energy usage and component temperatures. In some cases, the quasi-static performance is compared to at least two configurations to determine an optimized system configuration.

Furthermore, one or more embodiments provide a method of calculating the cooling energy use of a chiller-less data center with water cooled servers containing electronic equipment, in which the inputs are the local weather data for a typical year, the heat load profile of the electronic equipment, and thermal-hydraulic models and parameters of various cooling devices in the servers and the data center, the power usage characteristics of the various coolant pumping devices in the data center for varying coolant flow rates, the coolant pumping unit speed versus flow rate characteristics for various data center coolant pumping devices, a control technique for determining the speed of the coolant pumping units, and specifications for maximum values for various device temperatures, and the outputs are the total annual cooling energy use of all the coolant pumping devices and hour by hour device temperatures for various pertinent server devices and coolant locations.

One or more embodiments do not employ mechanical refrigeration units.

One or more embodiments provide a method that can be used to design or select hardware.

One or more embodiments provide a method of designing and selecting cooling configurations for a liquid cooled data center for which the time-varying power supply and demands may be used as inputs.

One or more embodiments provide computer-implemented tools for facilitating method steps.

Figure 16:
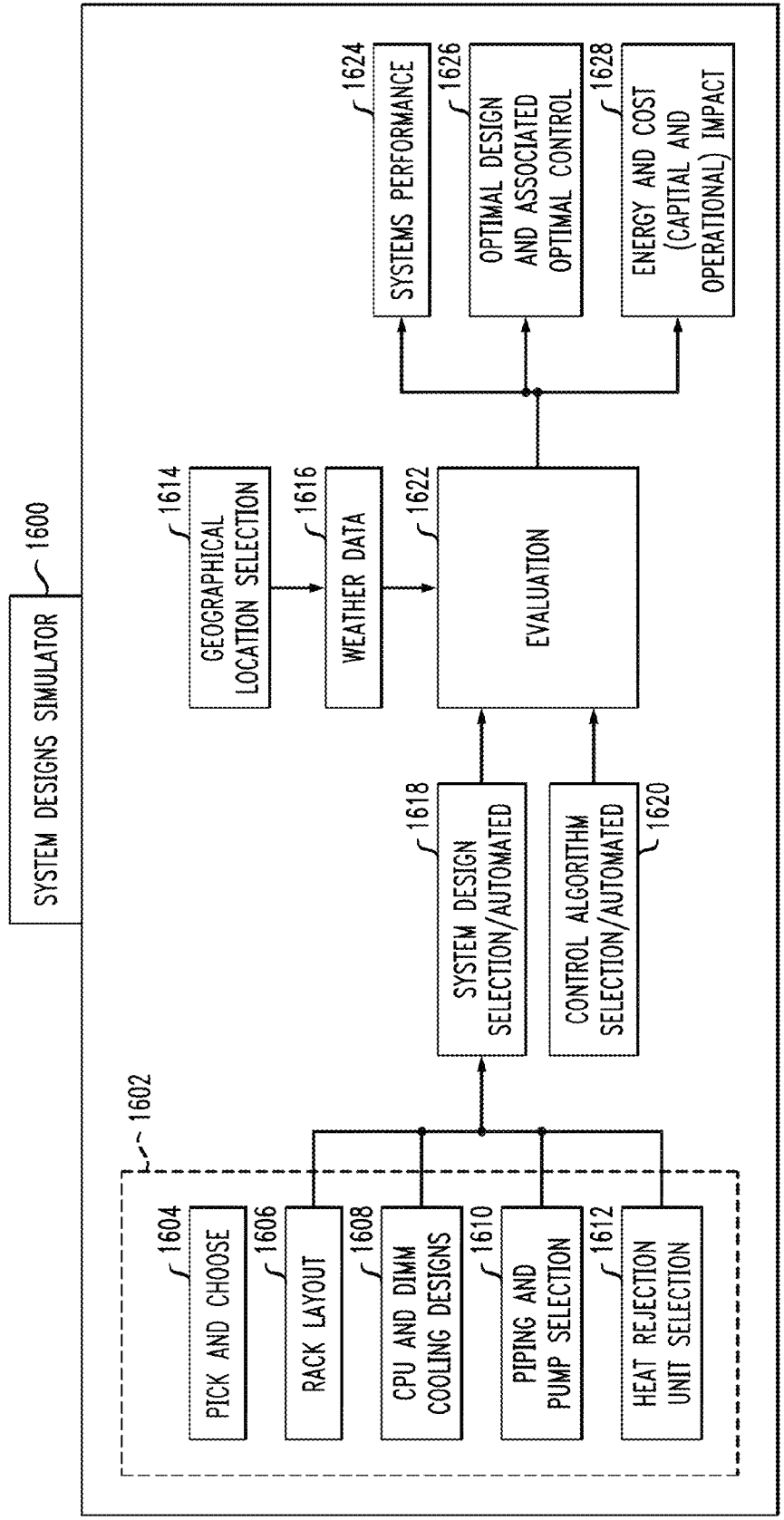
FIG. 16 is an exemplary software architecture diagram.

FIG. 16 presents an exemplary software architecture of a system design simulation tool 1600. A design module 1602 includes data for various pertinent design aspects, from which the designer can pick and choose as seen at 1604. Examples of design aspects include rack layout 1606, CPU and DIMM cooling designs 1608, piping and pump selection 1610, and heat rejection unit selection 1612. A geographical location section module 1614 includes weather data for various geographical locations and allows the designer to select a given city or town for which temperature (weather) data 1616 is available as a function of time. Evaluation module 1622 implements the logic in the flow charts (e.g., chart of FIG. 5B), based on the weather data 1616, system design 1618 (selected manually or in an automated fashion based on picking and choosing 1604), and an automated or manual selection of an appropriate control technique at 1620 (e.g., that shown in FIG. 5A or an alternative such as those discussed elsewhere herein). Outputs include system performance 1624, preferred design and associated preferred control 1626, and energy and cost (capital and operational) impact 1628. The inputs and outputs can be obtained and displayed via a GUI such as that shown in FIGS. 13 and 14.

Figure 17:
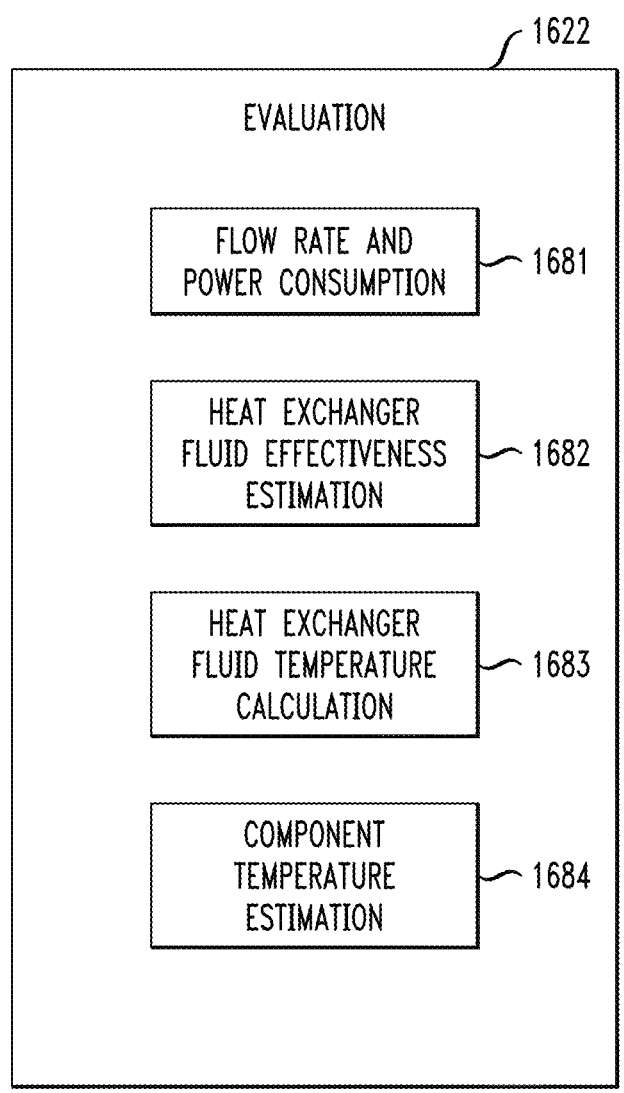
FIG. 17 shows exemplary details of evaluation engine 1622.

As seen in FIG. 17, in one or more embodiments, evaluation module 1622 includes a number of sub-modules. Flow rate and power consumption sub-module 1681 estimates flow rates and power consumption for the fan(s) and pump(s) given RPM (e.g. performs steps 508 and 509). Heat exchanger effectiveness estimation sub-module 1682 estimates heat exchanger effectiveness based on flow rates (e.g., performs steps 510, 512, and 514). Heat exchanger temperature calculation sub-module 1683 calculates the pertinent inlet and/or outlet temperatures, given the effectiveness (e.g. performs steps 511, 513, and 515). Component temperature estimation sub-module 1684 estimates the component temperatures based on the cold plate and/or side car parameters (e.g. performs step 516).

One or more embodiments are directed to a method of designing a chiller-less water (broadly understood to include pure water and/or water-glycol mixtures or the like) cooled data center. Such a data center is defined as one wherein no cooling of air or water (or water-glycol or the like) via a mechanical refrigeration cycle is employed; rather, a closed loop or loops employ a fluid such as water, water-glycol, or the like, cooled using ambient air by an outdoor heat exchanger. Heat rejection from the IT components into the closed loop or loops may be directly to the liquid via cold plates, cold rails, or the like, or into air and thence into the closed loop or loops via a side car or the like. In one or more embodiments, inputs include component thermal design, system and component thermal and hydrodynamic models, IT workload, and/or weather data for a chosen geographical location. In some instances, the model takes these inputs, and evaluates the optimal configuration for a given geographical location, as well as a preferred control method to be applied (a control technique is typically required because the ambient air conditions, and usually the system workload, are not constant; thus, air and/or liquid flow rates must be increased with increased workload and ambient temperature, and reduced with reduced workload and ambient temperature to dynamically minimize the cooling power consumption). In one or more embodiments, the evaluation is carried out using the process described with respect to steps (a) through (i) and FIG. 5B, for the specific control technique being used (FIG. 5A is a non-limiting example of a control technique).

Thus, in one or more embodiments it is desired to build a chiller-less liquid (ambient) cooled data center. One or more embodiments model the putative system and its components, to obtain a simulator. Different components can be substituted in the putative system; for example, a model of a high performance cold plate can be substituted for that of a low-performance cold plate, to determine whether the additional capital cost is justified. One pertinent input in evaluating the system performance is the chosen control method. FIG. 5A shows one non-limiting exemplary control technique. The chosen control technique can be varied in the simulation tool, just as the different components can be varied.

Because one or more embodiments employ ambient cooling, inputs include outdoor temperature (based on proposed geographic location and weather data), IT workload, components used in design of the system, and the control method used to operate the system. Unique challenges thus arise in design of a chiller-less liquid cooled data center, because of the significant dependency of system performance on ambient conditions (a system designed for use in Arizona will typically be different than one designed for use in Maine). Further, the preferred control technique may vary by geographic area as well the best control technique for Texas may be different than that for Maine.

One or more embodiments are implemented in the form of a software tool embodied in a non-transitory manner on one or more computer-readable storage media and executed by one or more hardware processors; the software can be written in any suitable language. One non-limiting example is the MATLAB® programming environment available from The MathWorks, Inc., Natick, Mass., U.S.A.

As used herein, "quasi-static" has the meaning understood by one skilled in the thermodynamic arts; namely, the system is in equilibrium as opposed to undergoing a transient. Furthermore in this regard, an example of a transient is a step response (e.g., suddenly turn servers on or off). One or more embodiments employ energy balance techniques which assume everything is in equilibrium. The skilled artisan will appreciate that the characteristic thermal time constant of the system is pertinent. If a step response is input (such as turning off a rack of servers), there is an intrinsic transient response to reach equilibrium (say, ½ hour). Where ambient temperature changes occur over many hours, in cases where the thermal time constant is sufficiently short (say, about ½ hour), the system can be modeled in an equilibrium state. Where the variability of boundary conditions (such as ambient temperature) is significantly slower than the intrinsic thermal time constant of the system, then the system is in equilibrium.

Thus, one or more embodiments include obtaining input data such as ambient temperature (weather data and/or geographic location), power dissipation (IT workload power), control technique, and hardware information (e.g., cold plate model may be an input or one or more cold plates with predetermined characteristics can be selected from a menu). With regard to hardware, choices are not limited to cold plate selection, but rather, all hardware-related and fluid-selection-related aspects can be input and/or selected from predetermined menus. Examples include pure liquid-cooled system with single loop; liquid system plus side car with single loop; pure liquid-cooled system with dual loop; liquid system plus side car with dual loop); chosen cooling fluid (water, water glycol, or other), brands and/or types of pumps, kinds of outdoor heat exchanger, pipe sizes; and the like.

Again, calculations in one or more embodiments are based on carrying out an energy balance under quasi-static conditions. FIGS. 5A and 5B are exemplary and non-limiting.

Outputs in one or more embodiments include cooling energy usage and component temperatures as a function of time. For a given ambient temperature and heat load, determine equilibrium temperature of components inside the data center, and the amount of cooling power. For a given heat load Q and a given outdoor air temperature, determine total energy input (motor power for fan(s) and pump(s)) and junction temperature(s) and/or other pertinent temperature(s). Cooling power is defined as the motor power for the fan(s) and pump(s).

Thus, one or more embodiments provide a method of designing a liquid cooled data center. One step includes building a model. The model has inputs, such as components and ambient conditions. Inputs can include, e.g., component thermal designs, component and system thermal-hydraulic models, active cooling elements performance curves, weather data and/or geographic location, IT workload power, control method, and the like. The input parameters are used to determine the quasi-static performance of the system including cooling energy usage and component temperatures.

In some cases, the quasi-static performance is compared among two or more configurations to determine an optimized system configuration. For example, compare single to dual loop—as discussed above. However, any configuration or selection of design(s) and/or component(s) can be compared to any other configuration(s). Some embodiments automatically compare two or more possible systems for given geography to find the best system.

One or more embodiments provide a method of calculating the cooling energy use of a chiller-less data center, with water cooled servers, containing electronic equipment, in which the inputs are the local weather data for a typical year, the heat load profile of the electronic equipment, thermal-hydraulic models and parameters of various cooling devices in the servers and the data center, the power usage characteristics of the various coolant pumping devices in the data center for varying coolant flow rates, the coolant pumping unit speed versus flow rate characteristics for various data center coolant pumping devices, a control technique for determining the speed of the coolant pumping units, and/or specifications for maximum values for various device temperatures. Furthermore, in one or more embodiments, the outputs are the total annual cooling energy use of all the coolant pumping devices and hour by hour device temperatures for various pertinent server devices and coolant locations.

Given the discussion thus far, it will be appreciated that, in general terms, an exemplary method includes the step 214 of obtaining input data. The input data specifies aspects of a thermal design of a liquid cooled data center, such as that shown in FIG. 1, 3A, or 3B. In general, the data center could be a chiller-less data center, a liquid cooled data center, a geothermal lop cooled data center, an ambient air cooled data center, a chiller-based-system-cooled data center, and the like. The input data includes data indicative of ambient outdoor temperature for the location of the data center; and/or data representing workload power dissipation for the data center. A further step 220 includes evaluating the input data to obtain performance (in some cases, quasi-static performance) of the data center thermal design. The performance includes cooling energy usage and/or at least one pertinent temperature associated with the data center. A further step 222 includes outputting the performance of the data center thermal design. The input and output steps can be carried out, for example, with a suitable GUI as shown in FIGS. 13 and 14.

The method can be used, for example, for design or for calculating cooling energy usage (for example, cooling energy usage of a chiller-less data center with water cooled servers containing electronic equipment).

As discussed elsewhere, input data can, in some cases, also include component thermal designs, component and system thermal-hydraulic models, active cooling elements performance curves, and/or control method. In a more specific example, the inputs are the local weather data for a typical year, the heat load profile of the electronic equipment, thermal-hydraulic models and parameters of various cooling devices in the servers and the data center, the power usage characteristics of the various coolant pumping devices in the data center for varying coolant flow rates, the coolant pumping unit speed versus flow rate characteristics for various data center coolant pumping devices, a control technique for determining the speed of the coolant pumping units, and specifications for maximum values for various device temperatures. Fan characterization data may also be provided. In a more specific example, the outputs include the total annual cooling energy use of all the coolant pumping devices and hour by hour device temperatures for various pertinent server devices and coolant locations.

In one or more embodiments, the data center has an indoor heat source such as 308 associated with the workload power dissipation: at least one fluid loop, with at least one pump 321, 325, transporting heat away from the indoor heat source; and at least one outdoor liquid-to-air heat exchanger 110, with at least one fan, rejecting the heat to the ambient outdoor temperature (various types of outdoor heat exchangers can be employed; for example, some embodiments could utilize evaporative cooling wherein water is sprayed on the coils). The evaluating may be carried out, for example, as described above with respect to FIGS. 5A, 5B, and/or 17 (e.g., calculations "A"). For example, in step 508, determine liquid and air flow rates corresponding to a given pump speed and a given fan speed. In step 509, estimate power consumption for the at least one fan and the at least one pump corresponding to the given pump speed and the given fan speed. In step 510, estimate effectiveness of the outdoor liquid-to-air heat exchanger at the given fan speed. In step 511, calculate temperature of the liquid entering and leaving the outdoor liquid-to-air heat exchanger and air temperature leaving the outdoor liquid-to-air heat exchanger. Use the results in step 516 to estimate the at least one pertinent temperature.

In some instances, as noted, the at least one fluid loop includes an outdoor fluid loop (e.g., with pump 325); the at least one pump includes an outdoor fluid loop pump 325; and the chiller-less liquid cooled data center further includes an indoor fluid loop (e.g., with pump 323), with at least one indoor fluid loop pump 323, coupled to the outdoor fluid loop with a liquid-to-liquid heat exchanger 327. Additional steps in such cases can include estimating effectiveness of the liquid-to-liquid heat exchanger in step 512; using the liquid-to-liquid heat exchanger effectiveness and the temperature of the liquid leaving the outdoor liquid-to-air heat exchanger, calculating liquid temperature entering and leaving the liquid-to-liquid heat exchanger on an indoor side thereof, in step 513; and using the temperature of the liquid leaving the liquid-to-liquid heat exchanger on the indoor side thereof to estimate the at least one pertinent temperature.

Some embodiments of a liquid cooled data center further includes a side car air-to-liquid heat exchanger 499 located in the fluid loop. In such cases, further steps can include iteratively estimating effectiveness of the side car air-to-liquid heat exchanger and calculating indoor air temperature entering and leaving the side car air-to-liquid heat exchanger and liquid temperature leaving the side car air-to-liquid heat exchanger, as per steps 514 and 515, and using at least one of the effectiveness of the side car air-to-liquid heat exchanger; the indoor air temperature entering the side car air-to-liquid heat exchanger, the indoor air temperature leaving the side car air-to-liquid heat exchanger, and the liquid temperature leaving the side car to estimate the at least one pertinent temperature, in step 516.

A side car can be used with single or double loop configurations as in FIGS. 3A and 3B.

Some embodiments further include obtaining a specification of a control scheme as part of the input data (for example, the user may pick from several possibilities available on a menu in the GUI). In other instances, one or more additional control schemes are applied and are compared to select a preferred control scheme. These schemes may be specified by the user or several options may be built into the system and the best available one for the given applications elected automatically. Non-limiting examples include the scheme of FIG. 5A and the above-discussed technique wherein outdoor heat exchanger fans are programmed to linearly vary in speed from 170 RPM to 500 RPM as the pre-MWU temperature varies from 30° C. to 35° C. For pre-MWU temperatures below 30° C. the fans run at a constant speed of 170 RPM.

The aforementioned at least one pertinent temperature may include a processor junction temperature, memory device temperature, hard-drive temperature, power supply temperature, auxiliary board components, rack fluid inlet temperature, and/or server inlet air temperature. Many embodiments have multiple pertinent temperatures that cannot exceed certain values.

The aforementioned data indicative of the ambient outdoor temperature could include, for example, a geographical location for the data center, which would then allow the time-temperature data to be looked up in a database, or could include actual temperature data versus time (e.g., weather data).

In one or more embodiments in the step of obtaining the input data, the input data further includes component 206 and overall layout 204 specification of the thermal design of the liquid cooled data center. Again, this can be arbitrary data or "canned" data built into the design tool.

Again, evaluations can be repeated, manually or automatically, for one or more alternative thermal designs of the data center; an optimum design is then selected based on the evaluation of the two or more candidate designs.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon. Some embodiments relate to a computer-aided design tool. For the avoidance of doubt, however, some embodiments include physical heat transfer and fluid flow hardware which may be computer controlled, controlled by humans, controlled by electromechanical and/or bimetallic controllers, and the like; a software embodiment could include, for example, a computer readable storage medium with instructions for system control and/or system design and/or optimization functionality. Thus, while some embodiments relate to a design tool, other embodiments, can be used in communication with a computer control hardware assembly.

One or more embodiments of the invention, or elements thereof, can be implemented in the form of an apparatus including a memory and at least one processor that is coupled to the memory and operative to perform exemplary method steps.

Figure 15:
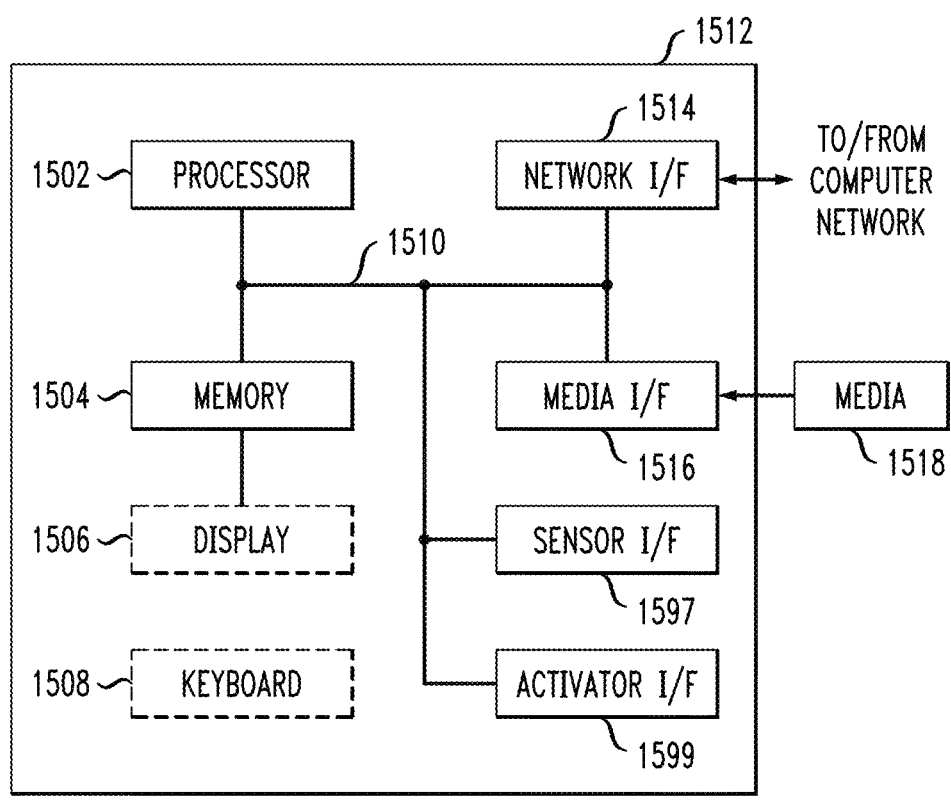
FIG. 15 depicts a computer system that may be useful in implementing one or more aspects and/or elements of the invention.

One or more embodiments can make use of software running on a general purpose computer or workstation. With reference to FIG. 15, such an implementation might employ, for example, a processor 1502, a memory 1504, and an input/output interface formed, for example, by a display 1506 and a keyboard 1508. The term "processor" as used herein with regard to FIG. 15 is intended to include any processing device, such as, for example, one that includes a CPU (central processing unit) and/or other forms of processing circuitry. Further, the term "processor" as used herein with regard to FIG. 15 may refer to more than one individual processor. The term "memory" as used herein with regard to FIG. 15 is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 1502, memory 1504, and input/output interface such as display 1506 and keyboard 1508 can be interconnected, for example, via bus 1510 as part of a data processing unit 1512. Suitable interconnections, for example via bus 1510, can also be provided to a network interface 1514, such as a network card, which can be provided to interface with a computer network, and to a media interface 1516, such as a diskette or CD-ROM drive, which can be provided to interface with media 1518.

Suitable interfaces can be provided to receive signals from sensors (e.g., temperature, pressure, flow rate, and/or valve position sensors) and/or to send signals to actuators for valves, vents, fans, and the like. These could be provided over network interface 1514 and/or via separate sensor interface 1597 and/or separate actuator interface 1599, including, for example, suitable digital-to-analog and/or analog-to-digital converters. Again, one or more embodiments relate to a computer-aided design tool. On the other hand, some embodiments can also be used in communication with a computer control hardware assembly. For example, the system model tool accepts the IT rack power and the outdoor air temperature as the input and evaluates to find the preferred cooling system settings (i.e., pumps and fans RPM) and then outputs these RPM values to the cooling hardware controller. In at least some embodiments, a design-methods-based tool is implemented in software embodied in a non-transitory manner on one or more computer-readable storage media and executed by one or more hardware processors.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1502 coupled directly or indirectly to memory elements 1504 through a system bus 1510. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 1508, displays 1506, pointing devices, and the like) can be coupled to the system either directly (such as via bus 1510) or through intervening I/O controllers (omitted for clarity).

Network adapters such as network interface 1514 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, server 402 in FIG. 4 and/or system 1512 as shown in FIG. 15) running a server program. It will be understood that such a physical server may or may not include a display and keyboard. Cooling aspects of the invention are not limited to servers but are applicable to many kinds of heat-dissipating electronic and/or computing equipment.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 1518 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules and/or sub-modules embodied on a computer readable storage medium; the modules can include, for example, one or more distinct software modules for control (e.g., to control the cooling systems) and/or system design, optimization and/or simulation (e.g. modules for blocks 1602, 1614, 1618, 1620, 1616, 1622, 1624, 1626, 1628 with sub-modules 1606, 1608, 1610, 1612, 1681, 1682, 1683, 1684; as well as one or more modules or sub-modules to implement a GUI such as shown in FIGS. 13 and 14). The method steps can then be carried out, or at least facilitated by, using the distinct software modules and/or sub-modules of the system, as described above, executing on one or more hardware processors 1502. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising the steps of:
   selecting a design for a liquid cooled data center using a computerized system design simulator tool, by:
      obtaining input data, said input data specifying aspects of a thermal design of a liquid cooled data center, said input data comprising at least one of:
         data indicative of ambient outdoor temperature for a location of said data center; and
         data representing workload power dissipation for said data center;
      evaluating said input data to obtain performance of said data center thermal design, said performance comprising at least one of:
         cooling energy usage; and
         one pertinent temperature associated with said data center;
      applying at least first and second control schemes, and comparing said first and second control schemes to select a preferred control scheme; and
      outputting said performance of said data center thermal design when operated in accordance with said preferred control scheme;
   wherein:
   said input data comprises at least said data representing workload power dissipation for said data center;
   said liquid cooled data center comprises a chiller-less liquid cooled data center, which in turn comprises an indoor heat source associated with said workload power dissipation; at least one fluid loop, with at least one pump, transporting heat away from said indoor heat source; and at least one outdoor liquid-to-air heat exchanger, with at least one fan, rejecting said heat to said ambient outdoor temperature; and said evaluating comprises:
  determining liquid and air flow rates corresponding, respectively, to a given pump speed and a given fan speed via at least one hardware processor;
  estimating power consumption for said at least one fan and said at least one pump corresponding to said given pump speed and said given fan speed via said at least one hardware processor;
  estimating effectiveness of said outdoor liquid-to-air heat exchanger at said given fan speed via said at least one hardware processor;
  calculating temperature of said liquid entering and leaving said outdoor liquid-to-air heat exchanger and air temperature leaving said outdoor liquid-to-air heat exchanger via said at least one hardware processor; and
  using at least said temperature of said liquid leaving said outdoor liquid-to-air heat exchanger to estimate said at least one pertinent temperature via said at least one hardware processor; and controlling operation of a physical liquid cooled data center built in accordance with said selected design, with said at least one processor, in accordance with said preferred control scheme, wherein said preferred control scheme comprises:
  setting speed of said at least one pump and said at least one fan to maximum;
  determining whether at least one temperature criteria associated with said indoor heat source is complied with when said speed of said at least one pump and said at least one fan is set to maximum;
  responsive to determining that said at least one temperature criteria associated with said indoor heat source is complied with when said speed of said at least one pump and said at least one fan is set to maximum:
    decrementing said speed of said at least one fan; and
    determining whether said at least one temperature criteria associated with said indoor heat source is complied with at said decremented fan speed; and
    repeating said fan speed decrementing step and said step of determining whether said at least one temperature criteria associated with said indoor heat source is complied with at said decremented fan speed for a plurality of additional decrements, until said at least one temperature criteria associated with said indoor heat source is no longer complied with or a minimum fan speed is reached.

2. The method of claim 1, wherein:
said at least one fluid loop comprises an outdoor fluid loop;
said at least one pump comprises an outdoor fluid loop pump; and
said chiller-less liquid cooled data center further includes an indoor fluid loop, with at least one indoor fluid loop pump, coupled to said outdoor fluid loop with a liquid-to-liquid heat exchanger;
further comprising the additional steps of:
  estimating effectiveness of said liquid-to-liquid heat exchanger;
  using said liquid-to-liquid heat exchanger effectiveness and said temperature of said liquid leaving said outdoor liquid-to-air heat exchanger, calculating liquid temperature entering and leaving said liquid-to-liquid heat exchanger on an indoor side thereof; and
  using said temperature of said liquid leaving said liquid-to-liquid heat exchanger on said indoor side thereof to estimate said at least one pertinent temperature.

3. The method of claim 2, wherein said chiller-less liquid cooled data center further comprises a side car air-to-liquid heat exchanger located in said fluid loop, further comprising the additional steps of:
  iteratively estimating effectiveness of said side car air-to-liquid heat exchanger; and calculating indoor air temperature entering and leaving said side car air-to-liquid heat exchanger and liquid temperature leaving said side car air-to-liquid heat exchanger; and
  using at least one of said effectiveness of said side car air-to-liquid heat exchanger, said indoor air temperature entering said side car air-to-liquid heat exchanger, said indoor air temperature leaving said side car air-to-liquid heat exchanger, and said liquid temperature leaving said side car, to estimate said at least one pertinent temperature.

4. The method of claim 1, wherein said chiller-less liquid cooled data center further comprises a side car air-to-liquid heat exchanger located in said indoor fluid loop, further comprising the additional steps of:
  iteratively estimating effectiveness of said side car air-to-liquid heat exchanger; and calculating indoor air temperature entering and leaving said side car air-to-liquid heat exchanger and liquid temperature leaving said side car air-to-liquid heat exchanger; and
  using at least one of said effectiveness of said side car air-to-liquid heat exchanger, said indoor air temperature entering said side car air-to-liquid heat exchanger, said indoor air temperature leaving said side car air-to-liquid heat exchanger, and said liquid temperature leaving said side car, to estimate said at least one pertinent temperature.

5. The method of claim 1, wherein, in said evaluating step, said at least one pertinent temperature comprises at least one of a processor junction temperature, memory device temperature, hard-drive temperature, power supply temperature, temperature of auxiliary board components, rack fluid inlet temperature, and server inlet air temperature.

6. The method of claim 1, wherein, in said step of obtaining said input data, said data indicative of said ambient outdoor temperature comprises a geographical location for said data center.

7. The method of claim 1, wherein, in said step of obtaining said input data, said data indicative of said ambient outdoor temperature comprises actual temperature data versus time.

8. The method of claim 1, wherein, in said step of obtaining said input data, said input data further comprises component and overall layout specification of said thermal design of said chiller-less liquid cooled data center.

9. The method of claim 1, further comprising repeating said evaluating step for at least one alternative thermal design of said data center, and selecting an optimum design based on said evaluating step and said repeated evaluating step.

10. A non-transitory computer readable medium comprising computer executable instructions which when executed by a computer cause the computer to perform a method comprising the steps of:
  selecting a design for a liquid cooled data center by:

obtaining input data, said input data specifying aspects of a thermal design of a liquid cooled data center, said input data comprising at least one of:
  data indicative of ambient outdoor temperature for a location of said data center; and
  data representing workload power dissipation for said data center;
evaluating said input data to obtain performance of said data center thermal design, said performance comprising at least one of:
  cooling energy usage; and
  one pertinent temperature associated with said data center;
applying at least first and second control schemes, and comparing said first and second control schemes to select a preferred control scheme; and
outputting said performance of said data center thermal design when operated in accordance with said preferred control scheme;
wherein:
said input data comprises at least said data representing workload power dissipation for said data center;
said liquid cooled data center comprises a chiller-less liquid cooled data center, which in turn comprises an indoor heat source associated with said workload power dissipation; at least one fluid loop, with at least one pump, transporting heat away from said indoor heat source; and at least one outdoor liquid-to-air heat exchanger, with at least one fan, rejecting said heat to said ambient outdoor temperature; and
said evaluating comprises:
  determining liquid and air flow rates corresponding, respectively, to a given pump speed and a given fan speed;
  estimating power consumption for said at least one fan and said at least one pump corresponding to said given pump speed and said given fan speed;
  estimating effectiveness of said outdoor liquid-to-air heat exchanger at said given fan speed;
  calculating temperature of said liquid entering and leaving said outdoor liquid-to-air heat exchanger and air temperature leaving said outdoor liquid-to-air heat exchanger; and
  using at least said temperature of said liquid leaving said outdoor liquid-to-air heat exchanger to estimate said at least one pertinent temperature; and
controlling operation of a physical liquid cooled data center built in accordance with said selected design, with said at least one processor, in accordance with said preferred control scheme, wherein said preferred control scheme comprises:
  setting speed of said at least one pump and said at least one fan to maximum;
  determining whether at least one temperature criteria associated with said indoor heat source is complied with when said speed of said at least one pump and said at least one fan is set to maximum;
  responsive to determining that said at least one temperature criteria associated with said indoor heat source is complied with when said speed of said at least one pump and said at least one fan is set to maximum:
    decrementing said speed of said at least one fan; and
    determining whether said at least one temperature criteria associated with said indoor heat source is complied with at said decremented fan speed; and
    repeating said fan speed decrementing step and said step of determining whether said at least one temperature criteria associated with said indoor heat source is complied with at said decremented fan speed for a plurality of additional decrements, until said at least one temperature criteria associated with said indoor heat source is no longer complied with or a minimum fan speed is reached.

11. The computer program product of claim 10, wherein:
said at least one fluid loop comprises an outdoor fluid loop;
said at least one pump comprises an outdoor fluid loop pump; and
said chiller-less liquid cooled data center further includes an indoor fluid loop, with at least one indoor fluid loop pump, coupled to said outdoor fluid loop with a liquid-to-liquid heat exchanger;
wherein said method further comprises:
  estimating effectiveness of said liquid-to-liquid heat exchanger;
  using said liquid-to-liquid heat exchanger effectiveness and said temperature of said liquid leaving said outdoor liquid-to-air heat exchanger, calculating liquid temperature entering and leaving said liquid-to-liquid heat exchanger on an indoor side thereof; and
  using said temperature of said liquid leaving said liquid-to-liquid heat exchanger on said indoor side thereof to estimate said at least one pertinent temperature.

12. The computer program product of claim 11, wherein said chiller-less liquid cooled data center further comprises a side car air-to-liquid heat exchanger located in said fluid loop, wherein said method further comprises:
  iteratively estimating effectiveness of said side car air-to-liquid heat exchanger; and calculating indoor air temperature entering and leaving said side car air-to-liquid heat exchanger and liquid temperature leaving said side car air-to-liquid heat exchanger; and
  using at least one of said effectiveness of said side car air-to-liquid heat exchanger, said indoor air temperature entering said side car air-to-liquid heat exchanger, said indoor air temperature leaving said side car air-to-liquid heat exchanger, and said liquid temperature leaving said side car, to estimate said at least one pertinent temperature.

13. The computer program product of claim 10, wherein said chiller-less liquid cooled data center further comprises a side car air-to-liquid heat exchanger located in said indoor fluid loop, wherein said method further comprises:
  iteratively estimating effectiveness of said side car air-to-liquid heat exchanger; and calculating indoor air temperature entering and leaving said side car air-to-liquid heat exchanger and liquid temperature leaving said side car air-to-liquid heat exchanger; and
  using at least one of said effectiveness of said side car air-to-liquid heat exchanger, said indoor air temperature entering said side car air-to-liquid heat exchanger, said indoor air temperature leaving said side car air-to-liquid heat exchanger, and said liquid temperature leaving said side car, to estimate said at least one pertinent temperature.

14. An apparatus comprising:
a memory; and
at least one processor, coupled to said memory, and operative to:

select a design for a liquid cooled data center using a computerized system design simulator tool, by being operative to:
  obtain input data, said input data specifying aspects of a thermal design of a liquid cooled data center, said input data comprising at least one of:
    data indicative of ambient outdoor temperature for a location of said data center; and
    data representing workload power dissipation for said data center;
  evaluate said input data to obtain performance of said data center thermal design, said performance comprising at least one of:
    cooling energy usage; and
    one pertinent temperature associated with said data center;
  apply at least first and second control schemes, and compare said first and second control schemes to select a preferred control scheme; and
  output said performance of said data center thermal design when operated in accordance with said preferred control scheme;
wherein:
said input data comprises at least said data representing workload power dissipation for said data center;
said liquid cooled data center comprises a chiller-less liquid cooled data center, which in turn comprises an indoor heat source associated with said workload power dissipation; at least one fluid loop, with at least one pump, transporting heat away from said indoor heat source; and at least one outdoor liquid-to-air heat exchanger, with at least one fan, rejecting said heat to said ambient outdoor temperature; and
said at least one processor is operative to evaluate by:
  determining liquid and air flow rates corresponding, respectively, to a given pump speed and a given fan speed;
  estimating power consumption for said at least one fan and said at least one pump corresponding to said given pump speed and said given fan speed;
  estimating effectiveness of said outdoor liquid-to-air heat exchanger at said given fan speed;
  calculating temperature of said liquid entering and leaving said outdoor liquid-to-air heat exchanger and air temperature leaving said outdoor liquid-to-air heat exchanger; and
  using at least said temperature of said liquid leaving said outdoor liquid-to-air heat exchanger to estimate said at least one pertinent temperature; and
control operation of a physical liquid cooled data center built in accordance with said selected design, with said at least one processor, in accordance with said preferred control scheme, wherein said preferred control scheme comprises:
  setting speed of said at least one pump and said at least one fan to maximum;
  determining whether at least one temperature criteria associated with said indoor heat source is complied with when said speed of said at least one pump and said at least one fan is set to maximum;
  responsive to determining that said at least one temperature criteria associated with said indoor heat source is complied with when said speed of said at least one pump and said at least one fan is set to maximum:
    decrementing said speed of said at least one fan; and
    determining whether said at least one temperature criteria associated with said indoor heat source is complied with at said decremented fan speed; and
    repeating said fan speed decrementing step and said step of determining whether said at least one temperature criteria associated with said indoor heat source is complied with at said decremented fan speed for a plurality of additional decrements, until said at least one temperature criteria associated with said indoor heat source is no longer complied with or a minimum fan speed is reached.

15. The apparatus of claim 14, further comprising said at least one pump and said at least one fan, said at least one pump and said at least one fan being coupled to said at least one processor with said speeds controlled thereby.

\* \* \* \* \*